United States Patent
Chang et al.

(10) Patent No.: US 12,131,992 B2
(45) Date of Patent: Oct. 29, 2024

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Chun-Wei Chang, Taoyuan (TW); Hsuan-Ming Huang, Hsinchu (TW); Jian-Hong Lin, Yunlin (TW); Ming-Hong Hsieh, Taoyuang (TW); Mingni Chang, Hsinchu (TW); Ming-Yih Wang, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/489,864

(22) Filed: Oct. 19, 2023

(65) Prior Publication Data
US 2024/0047345 A1 Feb. 8, 2024

Related U.S. Application Data

(63) Continuation of application No. 17/244,783, filed on Apr. 29, 2021, now Pat. No. 11,830,806.

(51) Int. Cl.
*H01L 23/522* (2006.01)
*H01L 21/66* (2006.01)
*H01L 21/768* (2006.01)
*H01L 23/532* (2006.01)

(52) U.S. Cl.
CPC .... *H01L 23/5226* (2013.01); *H01L 21/76843* (2013.01); *H01L 22/14* (2013.01); *H01L 23/53209* (2013.01)

(58) Field of Classification Search
CPC .......... H01L 23/5226; H01L 21/76843; H01L 22/14; H01L 23/53209; H01L 24/05; H01L 23/528; H01L 23/5386
See application file for complete search history.

(56) References Cited

U.S. PATENT DOCUMENTS

2011/0061911 A1* 3/2011 Jeon ............. H01L 21/4857
174/258
2021/0375791 A1* 12/2021 Oda ............. H01L 23/564

* cited by examiner

*Primary Examiner* — Karen Kusumakar
(74) *Attorney, Agent, or Firm* — WPAT Law; Anthony King

(57) ABSTRACT

A semiconductor structure and method of manufacturing a semiconductor structure are provided. The semiconductor structure includes a package structure. The package structure includes a passivation layer formed over an interconnect structure; an electrically-conductive structure formed on the passivation layer and extending through the passivation layer to electrically contact the interconnect structure; a dielectric structure formed over the passivation layer and surrounding the electrically-conductive structure to expose at least a portion of a top surface of the electrically-conductive structure; and a metallic protection structure formed on the top surface of the electrically-conductive structure exposed from the dielectric structure. The top surface of the metallic protection structure is aligned with or lower than a top surface of the dielectric structure.

20 Claims, 39 Drawing Sheets

SEMICONDUCTOR STRUCTURE AND METHOD OF MANUFACTURING THE SAME

PRIORITY CLAIM AND CROSS-REFERENCE

This application a continuation application of U.S. patent application Ser. No. 17/244,783 filed on Apr. 29, 2021, entitled of "SEMICONDUCTOR STRUCTURE AND METHOD OF MANUFACTURING THE SAME"; this application is incorporated herein by reference in their entireties.

BACKGROUND

Modern day integrated chips comprise millions or billions of semiconductor devices arranged within a semiconductor substrate (e.g., a silicon wafer). The semiconductor devices are connected to an overlying back-end-of-the-line (BEOL) metallization stack comprising a plurality of metal interconnect layers (e.g., wires and vias). The plurality of metal interconnect layers electrically connect the semiconductor devices to each other and to external components. Often the metal interconnect layers terminate at a bond pad located over the BEOL metallization stack. The bond pad may comprise a thick layer of metal that provides a conductive connection from the integrated chip to the external components (e.g., an integrated chip package).

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
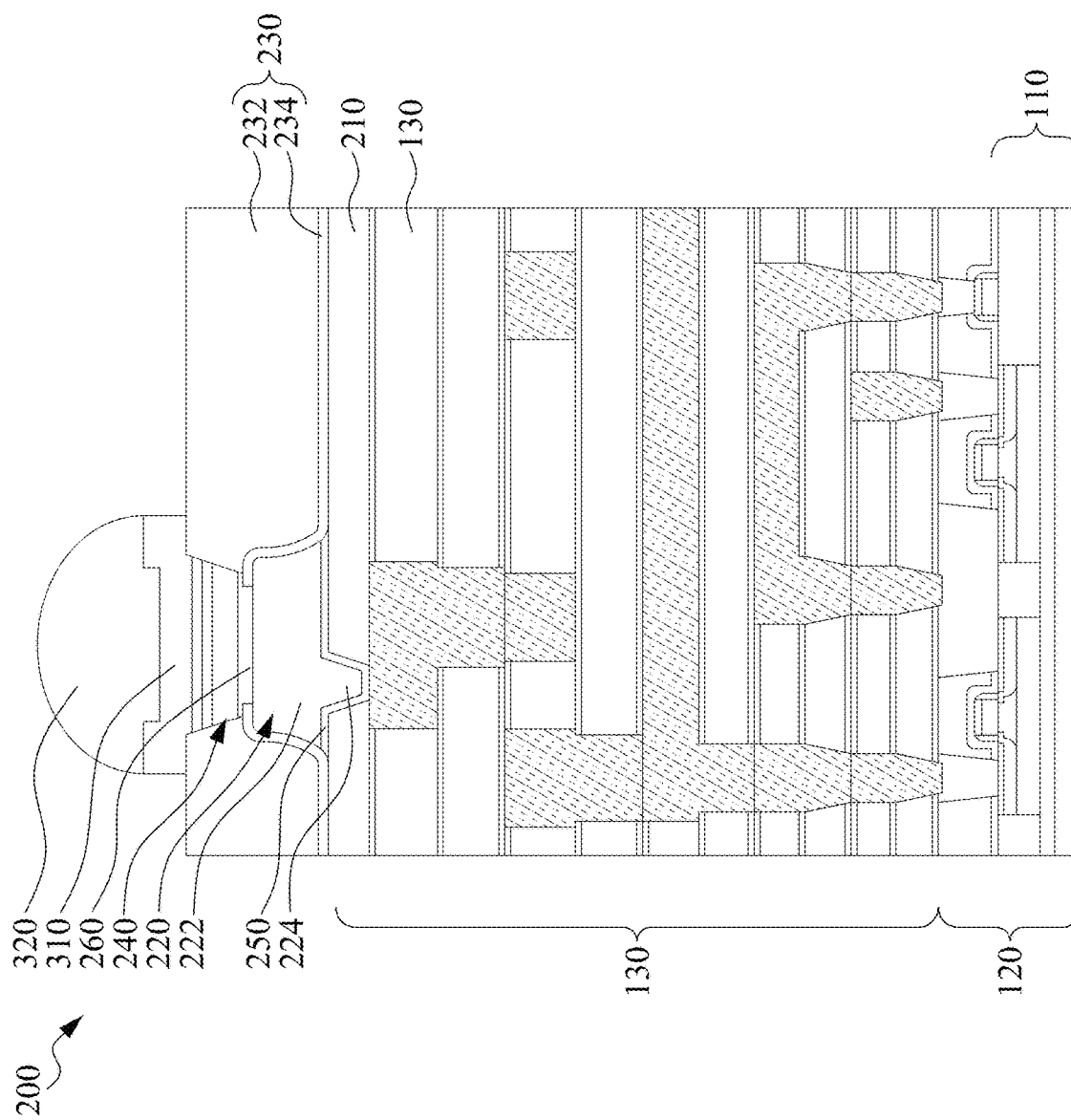
FIG. 1 is a fragmentary cross-sectional view of a semiconductor structure, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Semiconductor devices within an integrated chip (IC) are connected to a package structure by way of a back-end-of-the-line (BEOL) metallization stack comprising a plurality of metal interconnect layers (e.g., wires and vias). In the package structure, copper is usually used to electrically connect to the metal interconnect layers since copper can improve the chip performance in a cost-effective way. However, oxidation of copper may influence the performance of the semiconductor devices. For example, the resulting oxide layer would make much noise present in semiconductor devices when measurement or would make wire-bond attaching difficult. In particular, when copper is exposed in an elevated temperature environment, such as during reliability testing, the oxidation of copper and the resulting problems would become more obvious and severe. The copper may be used as a bonding pad, but copper oxide may cause the following wire-bonding process difficult and make wire detached from the bonding pad.

FIG. 1 is a fragmentary cross-sectional view of a semiconductor structure. An IC manufacturing process flow can typically be divided into four categories, including front-end-of-line (FEOL), middle-end-of-line (MEOL), back-end-of-line (BEOL) processes and packaging processes. In some embodiments, the devices formed by the FEOL processes can be referred to as FEOL devices 110, the connecting structures formed by the MEOL processes can be referred to as MEOL connecting structures 120, the multilayer interconnect (MLI) structures formed by the BEOL processes can be referred to as BEOL interconnect structures 130, and the structures formed by the packaging process can be integrally referred to as a package structure 200. Accordingly, a semiconductor structure can include the FEOL devices 110, the MEOL connecting structures 120, the BEOL interconnect structures 130 and the package structure 200. FEOL generally encompasses processes related to fabrication of IC devices, such as transistors. For example, FEOL processes can include forming isolation structures for isolating IC devices, gate structures, and source and drain structures (also referred to as source/drain structures) that form a transistor. MEOL generally encompasses processes related to fabrication of connecting structures (also referred to as contacts or plugs) that connect to conductive features (or conductive regions) of the IC devices. For example, MEOL processes can include forming connecting structures that connect to the gate structures and connecting structures that connect to the source/drain structures. BEOL generally encompasses processes related to fabrication of MLI structures that electrically connect the IC devices and the connecting structures fabricated by FEOL and MEOL processes.

Figure 2:
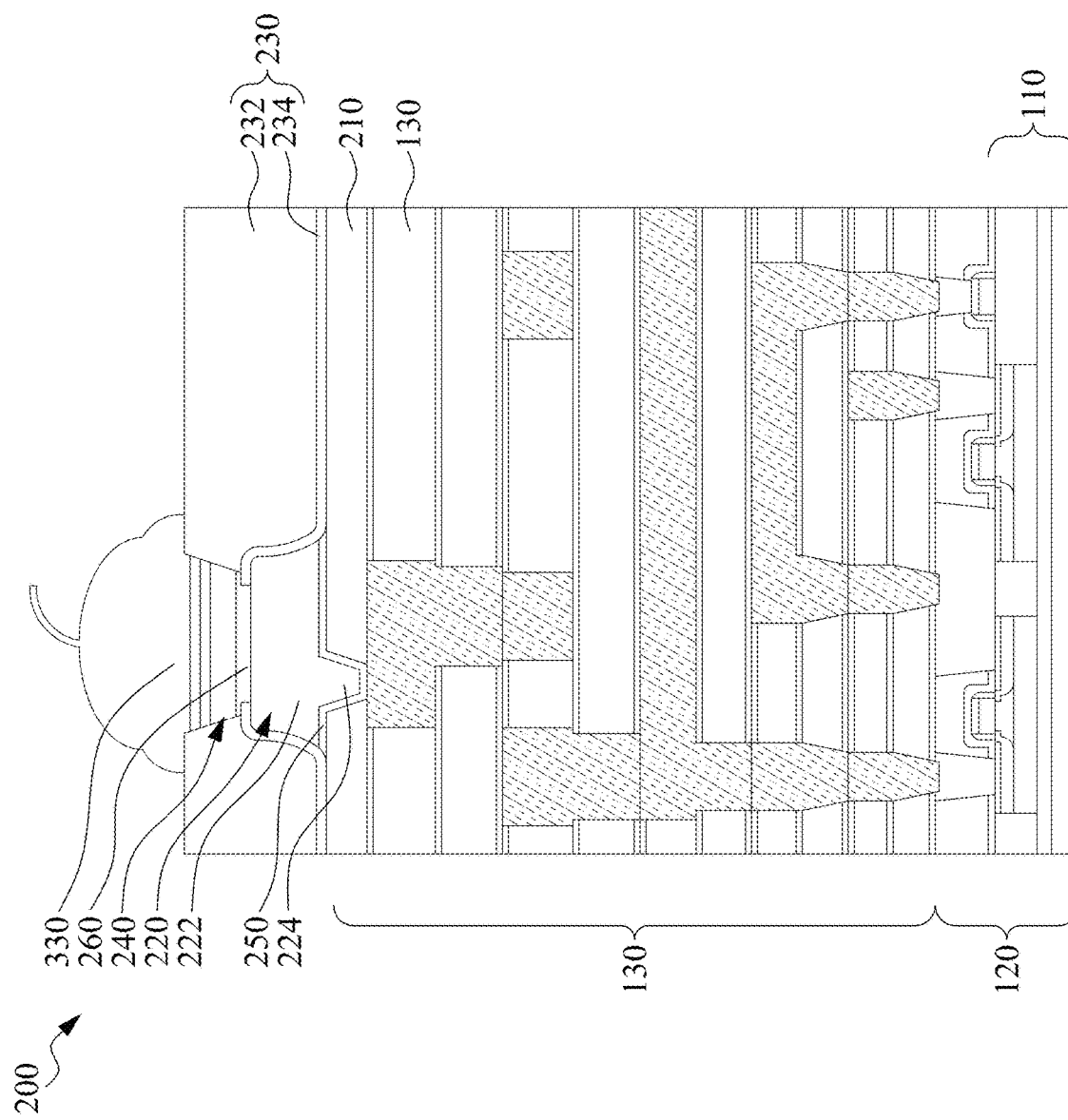
FIG. 2 is a fragmentary cross-sectional view of a semiconductor structure, in accordance with some embodiments of the present disclosure.

The package structure 200 may connect to other components using various wire bonding techniques such as thermocompression bonding or thermosonic bonding, resulting in a ball or wedge bond at the formed bond pad. In some embodiments, an external connection structure may be formed on the package structure 200. For example, an under bump metallization (UBM) structure 310 and a presolder 320 may be formed on the package structure 200 as shown in FIG. 1. In some alternative embodiments, a wire bond 330 (or wedge bond) may be formed on the package structure 200 for wire boding or wedge bonding as shown in FIG. 2.

In some embodiments, the package structure 200 may be formed on an interconnect structure 130 and may include a passivation layer 210, an electrically-conductive structure 220, a dielectric structure 230 and a protection structure 240.

The passivation layer 210 can be formed on the interconnect structure 130. In various embodiments, the passivation layer 210 may include materials with a low dielectric constant (low-κ) such as undoped silicate glass (USG), an oxide, such as silicon dioxide, or an extremely low dielectric material. In some embodiments, the passivation layer 210 may have a thickness ranging from about 0.75 μm to about 3 μm. In some embodiments, the passivation layer 210 may have a thickness of about 1.5 μm.

The electrically-conductive structure 220 can be formed on the passivation layer 210 and extend through the passivation layer 210 so that the electrically-conductive structure 220 can be in physical and electrical contact with an underlying final (i.e., top) metal interconnect layer of the interconnect structure 130. In some embodiments, the electrically-conductive structure 220 may be referred to as a redistribution layer (RDL), but the disclosure is not limited thereto. The electrically-conductive structure 220 may be formed by a deposition process and/or a plating process followed by lithographic patterning and etching processes. In various embodiments, the electrically-conductive structure 220 may comprise a conductive material, such as copper. In some embodiments, a first barrier layer 250 may be arranged between the electrically-conductive structure 220 and the passivation layer 210. Further, the first barrier layer 250 may be arranged between the electrically-conductive structure 220 and the underlying interconnect structure 130. The first barrier layer 250 may comprise titanium (Ti), tantalum (Ta), titanium nitride (TiN), tantalum nitride (TaN), tungsten (W), other metal nitrides or a combination thereof.

In some embodiments, the electrically-conductive structure 220 comprises an upper portion 222 and a lower portion 224. The upper portion 222 can be disposed over the passivation layer 210 and may have a thickness ranging from about 2 μm to about 12 μm. In some embodiments, the upper portion 222 have a thickness of about 5.5 μm. The lower portion 224 can be formed in the passivation layer 210 and can extend from the upper portion 222 to the interconnect structure 130 so as to electrically contact the interconnect structure 130. Thus, the lower portion 224 may have a thickness corresponding to the thickness of the passivation layer 210.

The dielectric structure 230 can be formed over the passivation layer 210 and surround the electrically-conductive structure 220 to expose at least a portion of a top surface of the electrically-conductive structure 220. In some embodiments, the dielectric structure 230 may comprise a first dielectric layer 232 and a second dielectric layer 234. The top surface of the first dielectric layer 232 can be higher than the top surface of the electrically-conductive structure 220. The second dielectric layer 234 may be disposed between the electrically-conductive structure 220 and the first dielectric layer 232 and may be also disposed between the first dielectric layer 232 and the passivation layer 210. In some embodiments, the second dielectric layer 234 formed on the electrically-conductive structure 220 may be partially exposed from the first dielectric layer 232. For example, an edge of the second dielectric layer 234 may be exposed from the first dielectric layer 232. The first dielectric layer 232 and the second dielectric layer 234 may include different materials. In some embodiments, the first dielectric layer 232 may include polyimide (PI), and the second dielectric layer 234 may include silicon nitride, but the disclosure is not limited thereto.

In some embodiments, the ratio of a thickness of the first dielectric layer 232 to a thickness of the second dielectric layer 234 may be from about 10:1 to about 16:1. In some embodiments, the first dielectric layer 232 may have a thickness ranging from about 3 μm to about 28 μm. In some embodiments, the first dielectric layer 232 may have a thickness of about 14 μm. In some embodiments, the second dielectric layer 234 may have a thickness ranging from about 0.9 μm to about 1.3 μm.

The protection structure 240 may be formed on the electrically-conductive structure 220. In some embodiments, the edge of the polyimide layer 234 exposed from the first dielectric layer 232 may be overlaid with the protection structure 240. The protection structure 240 may comprise a single-layer structure or a multi-layer structure. The protection structure 240 may comprise electrically conductive materials, such as metal or metal alloy, including, but not limited to aluminum (Al), nickel (Ni), palladium (Pd), golden (Au), tungsten (W), alloy thereof, such as nickel-gold (NiAu), aluminum-copper (AlCu), or a combination thereof. In some embodiments, a ratio of a thickness of the protection structure 240 to a thickness of the upper portion 222 of the electrically-conductive structure 220 may be from about 1:1 to about 1:110.

FIGS. 3 to 9 illustrate the package structure 200 according to various embodiments of the present disclosure. It should be noted that same elements in FIGS. 3 to 9 are indicated by the same numerals, and can include a same material.

Figure 3:
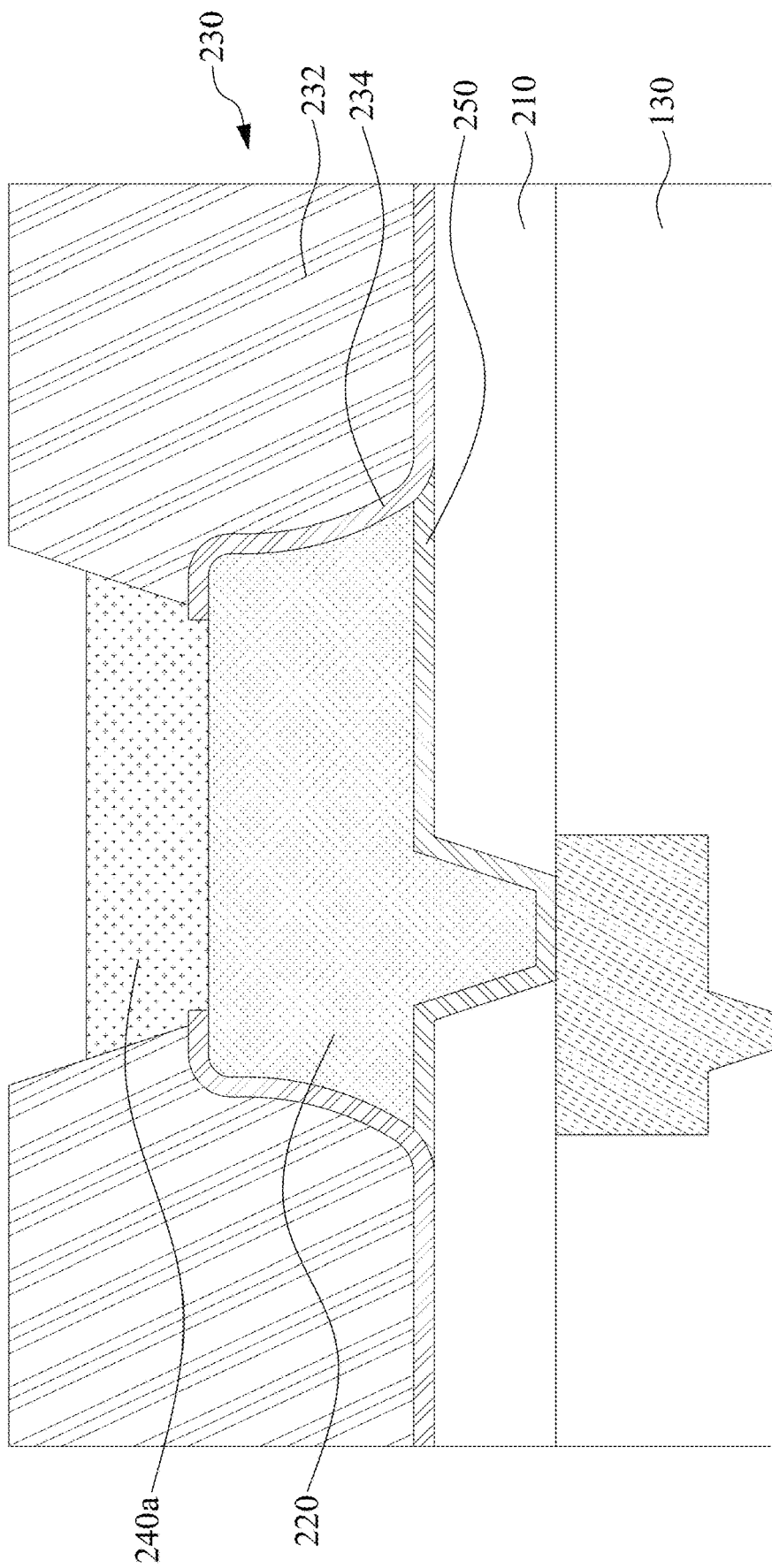
FIGS. 3 to 9 illustrate cross-sectional views of a package structure of a semiconductor structure, in accordance with various embodiments of the present disclosure.

In some embodiments, as shown in FIG. 3, the protection structure 240a can be formed on the exposed top surface of the electrically-conductive structure 220 and can be surrounded by the dielectric structure 230. A top surface of the protection structure 240a may be lower than the top surface of the first dielectric layer 232. A bottom surface of the protection structure 240a may abut (i.e., in contact with) the top surface of the electrically-conductive structure 220. The protection structure 240a may be a single-layer structure including an aluminum (Al) layer, a nickel (Ni) layer, a palladium (Pd) layer, a golden (Au) layer, a tungsten (W) layer, a nickel-gold (NiAu) layer, an aluminum-copper (AlCu) layer or a combination thereof. In some embodiments, when the protection structure 240a is a single-layer structure, the protection structure 240a may have a thickness ranging from about 0.1 µm to about 10 µm.

Figure 4:
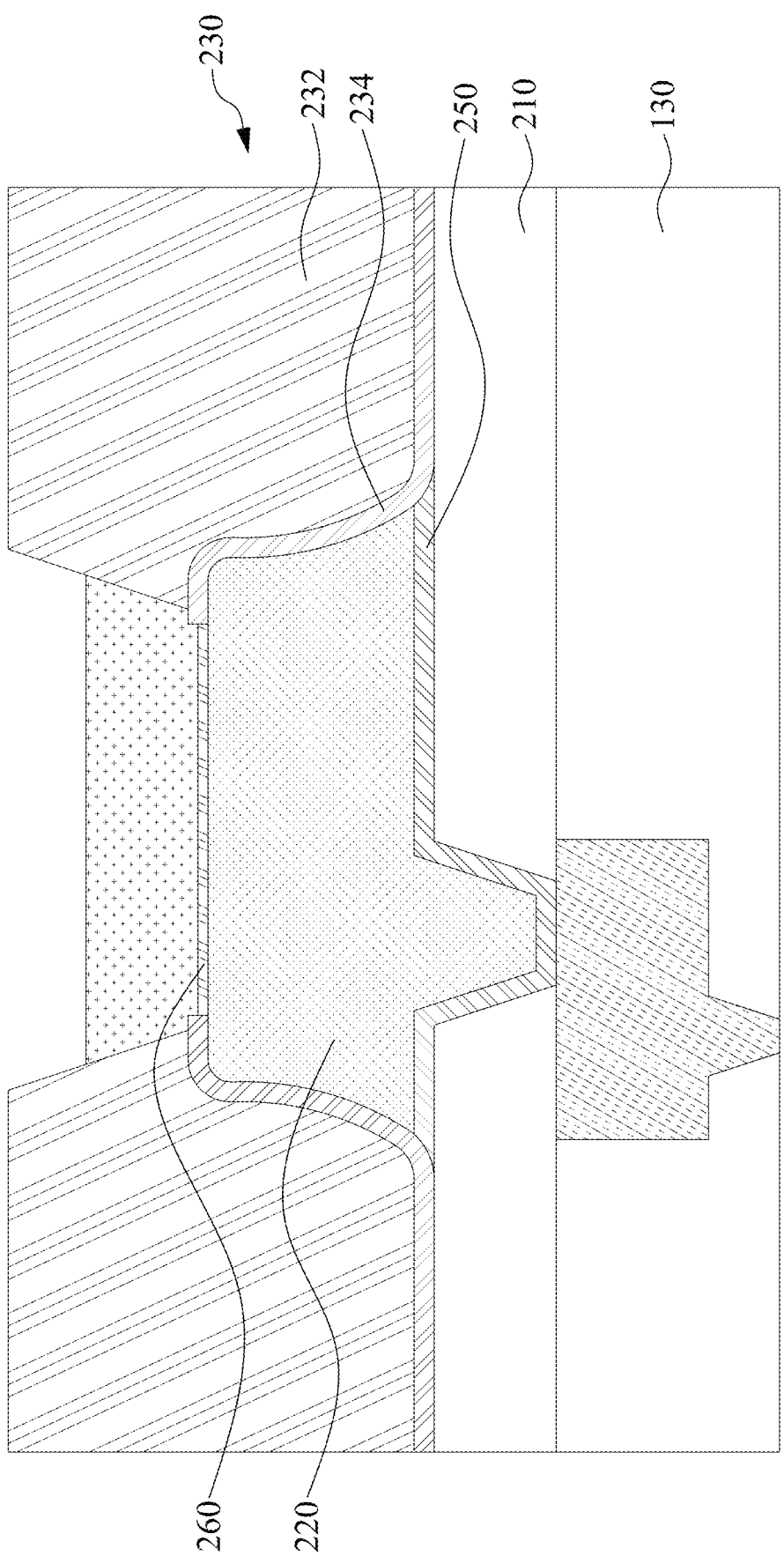

As shown in FIG. 4, a second barrier layer 260 may be arranged between the protection structure 240a and the electrically-conductive structure 220. The second barrier layer 260 may comprise titanium (Ti), tantalum (Ta), titanium nitride (TiN), tantalum nitride (TaN), tungsten (W), other metal nitrides or a combination thereof. The second barrier layer 260 may be surrounded by the dielectric structure 230. In some embodiments, the second barrier layer 260 may abut the edge of polyimide layer 234 and/or abut the first dielectric layer 232. The second barrier layer 260 may have a thickness ranging from about 3 nm to about 300 nm.

Figure 5:
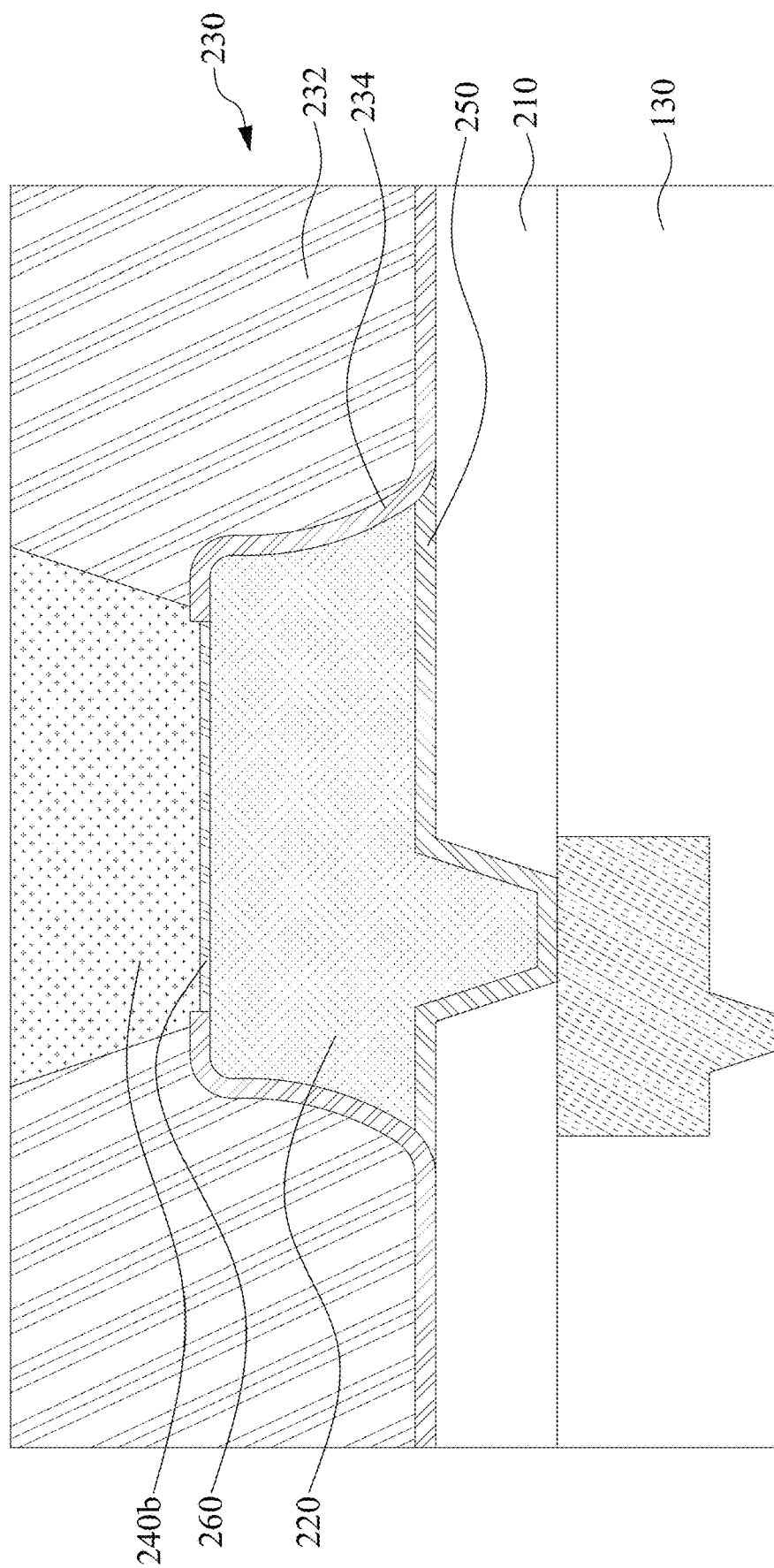

In some embodiments, according to FIG. 5, a protection structure 240b can be a single-layer structure where a top surface of the protection structure 240b may be aligned with the top surface of the first dielectric layer 232. In some embodiments, the bottom surface of the protection structure 240b may abut the top surface of the electrically-conductive structure 220, though not shown. In some alternative embodiments, a second barrier layer 260 may be sandwiched between the protection structure 240b and the electrically-conductive structure 220.

Figure 6:
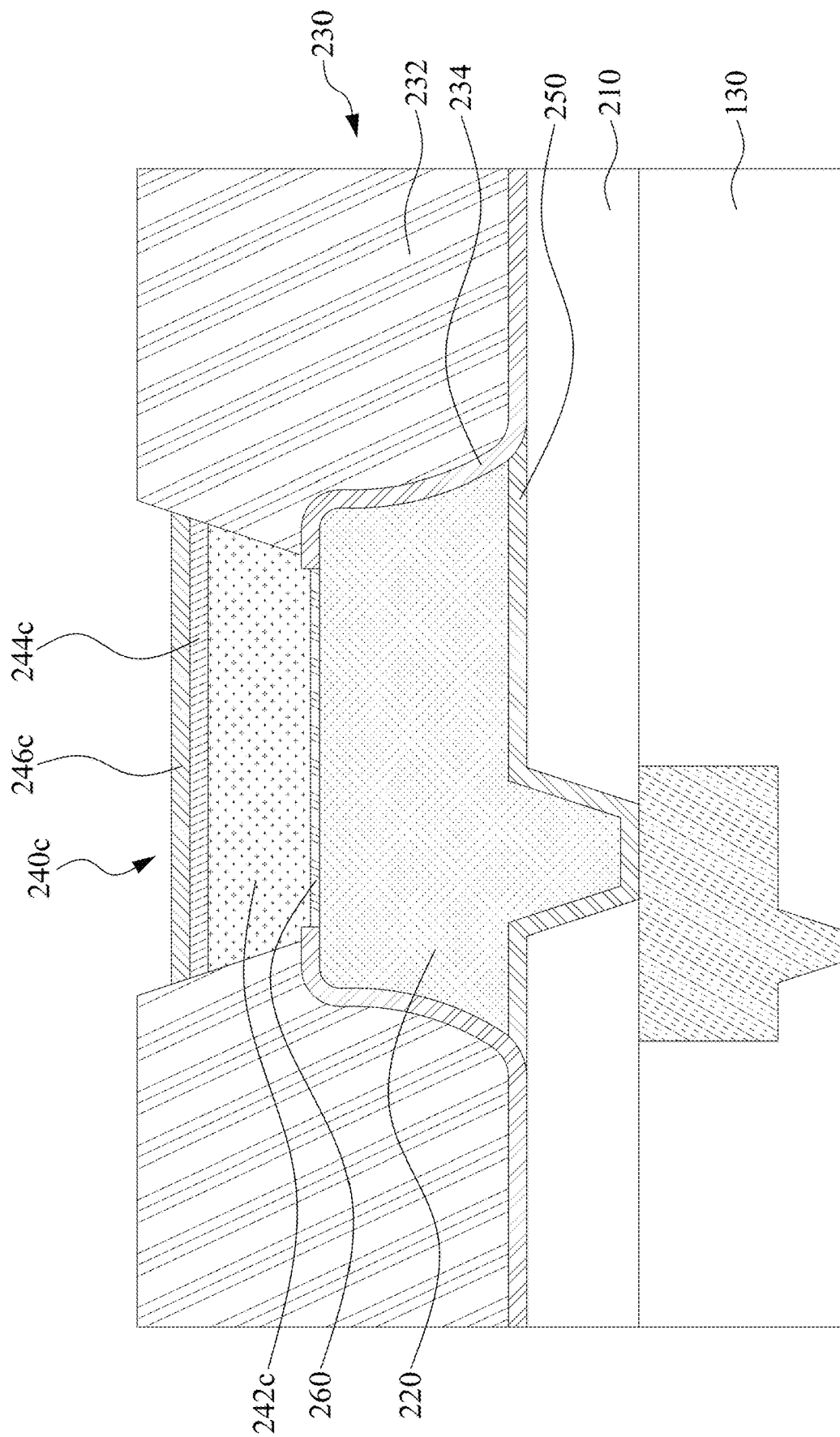

In FIG. 6, the protection structure 240c may be a multi-layer structure. In some embodiments, the protection structure 240c may include a Ni layer 242c, a Pd layer 244c and an Au layer 246c. The Ni layer 242c can be formed on the electrically-conductive structure 220. In some embodiments, a bottom surface of the Ni layer 242c may abut the top surface of the electrically-conductive structure 220. In some alternative embodiments, a second barrier layer 260 may be formed between the Ni layer 242c and the electrically-conductive structure 220. The Pd layer 244c may be disposed on the Ni layer 242c. The Au layer 246c may be disposed on the Pd layer 244c. In some embodiments, the top surface of the Au layer 246c may be lower than the top surface of the first dielectric layer 232.

In some embodiments, a ratio of thicknesses of the Ni layer 242c to that of the Pd layer 244c is from about 75:1 to about 85:1. In some embodiments, a ratio of thicknesses of the Ni layer 242c to that of the Au layer 246c is from about 10:1 to about 11:1. In some embodiments, the thickness of the Ni layer 242c may range from about 4.0 µm to about 4.4 µm. In some embodiments, the thickness of the Pd layer 244c may range from about 10 nm to about 300 nm. In some embodiments, the thickness of the Pd layer 244c may be about 0.052 µm. In some embodiments, the thickness of the Au layer 246c may range from about 0.1 µm to about 10 µm. In some embodiments, the thickness of the Au layer 246c may be about 0.4 µm.

Figure 7:
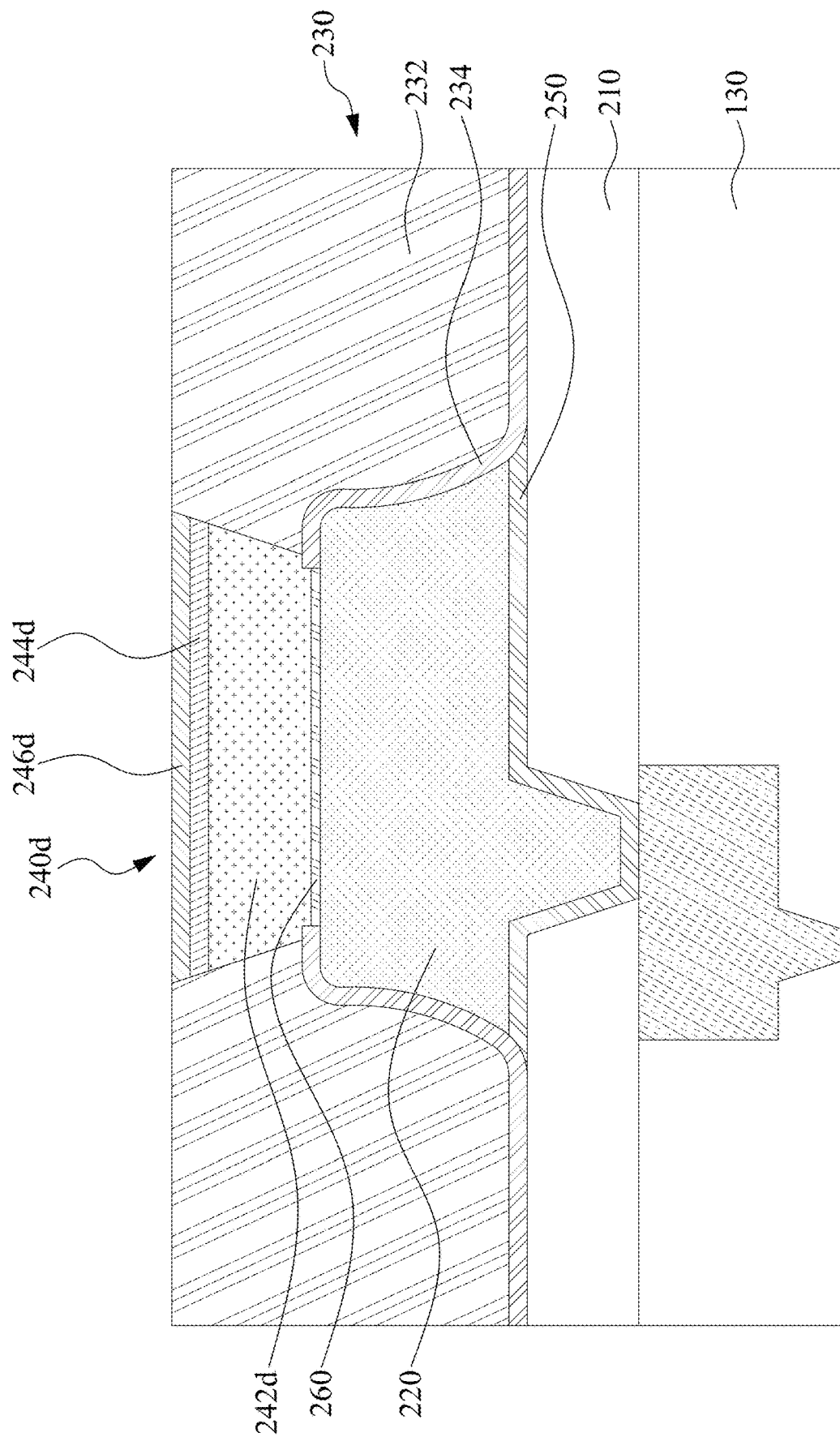

In some embodiments, according to FIG. 7, a protection structure 240d can be a multi-layer structure comprising a Ni layer 242d, a Pd layer 244d and an Au layer 246d where the top surface of the Au layer 246d may be aligned with the top surface of the first dielectric layer 232. In some embodiments, the bottom surface of the Ni layer 242d may abut the top surface of the electrically-conductive structure 220. In some alternative embodiments, a second barrier layer 260 may be sandwiched between the protection structure 240d and the electrically-conductive structure 220.

Figure 8:
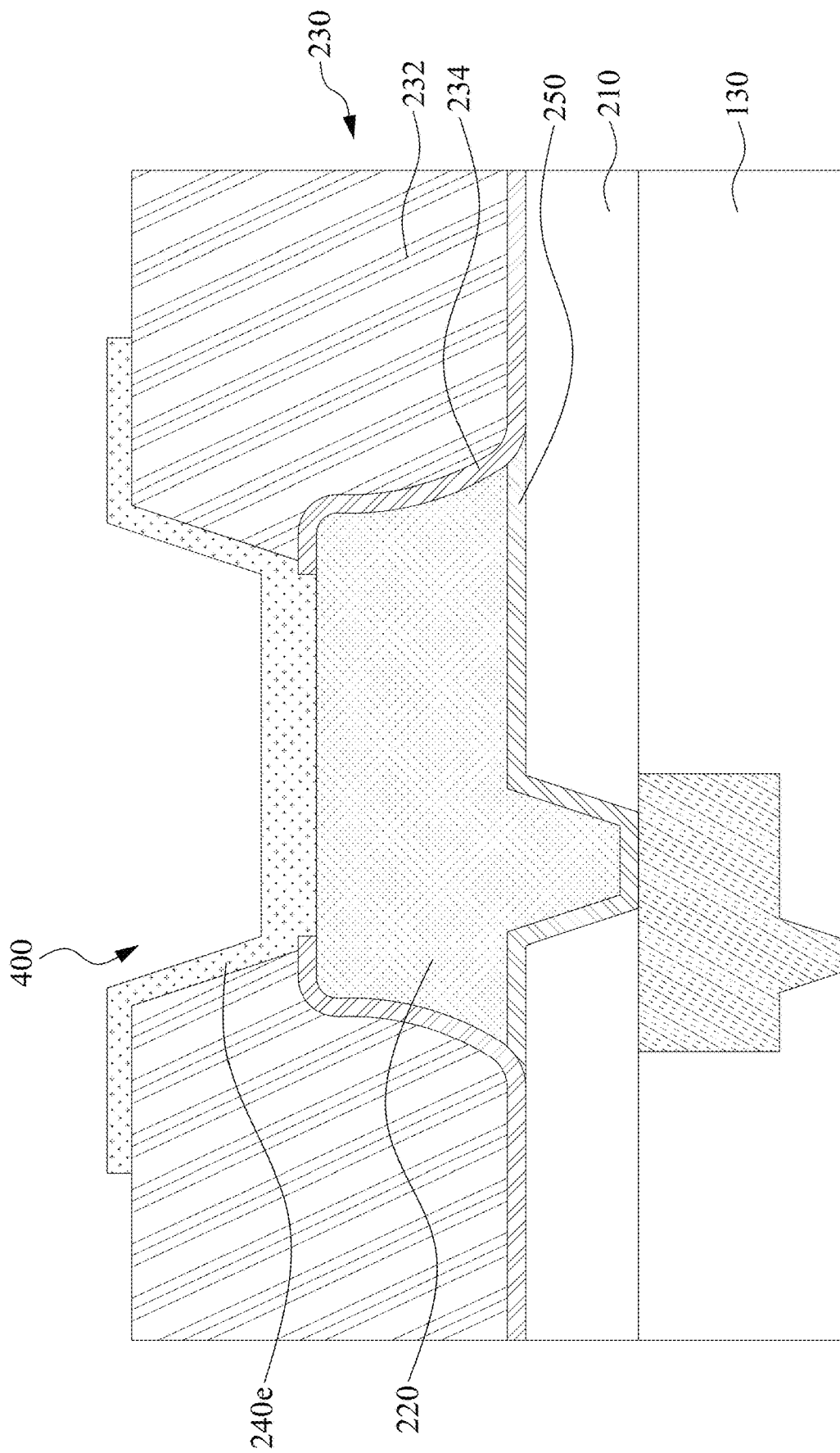
Figure 9:
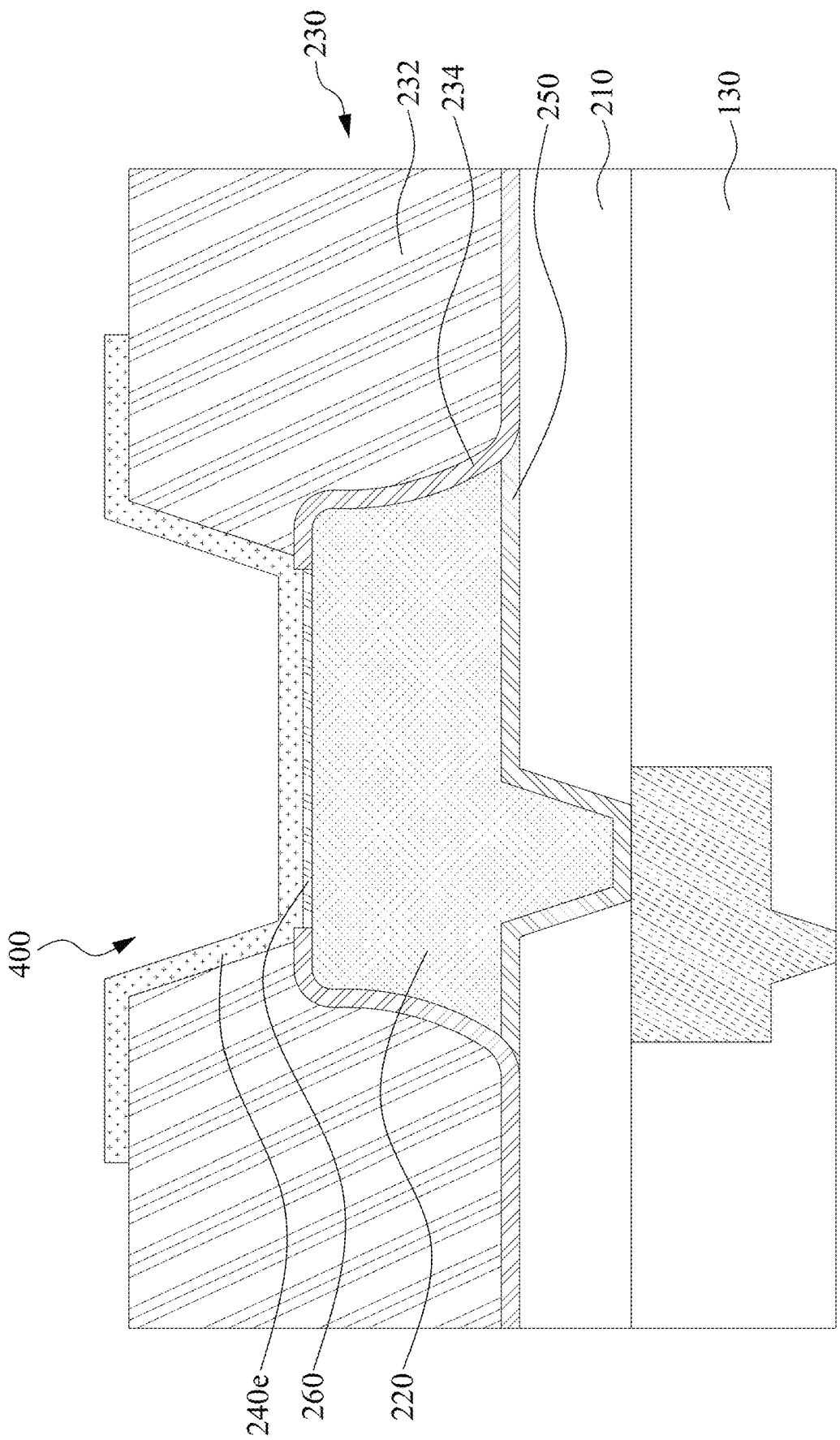

With reference to FIG. 8, a protection structure 240e may be formed in an opening 400 and on the top surface of the electrically-conductive structure 220 exposed from the opening 400 and may further extend along the sidewall of first dielectric layer 232 in the opening 400 to partially cover a portion of the top surface of the first dielectric layer 232. In some embodiments, the bottom surface of the protection structure 240e may abut the top surface of the electrically-conductive structure 220. In some alternative embodiments, a second barrier layer 260 may be sandwiched between the protection structure 240e and the electrically-conductive structure 220 as shown in FIG. 9.

Figure 10:
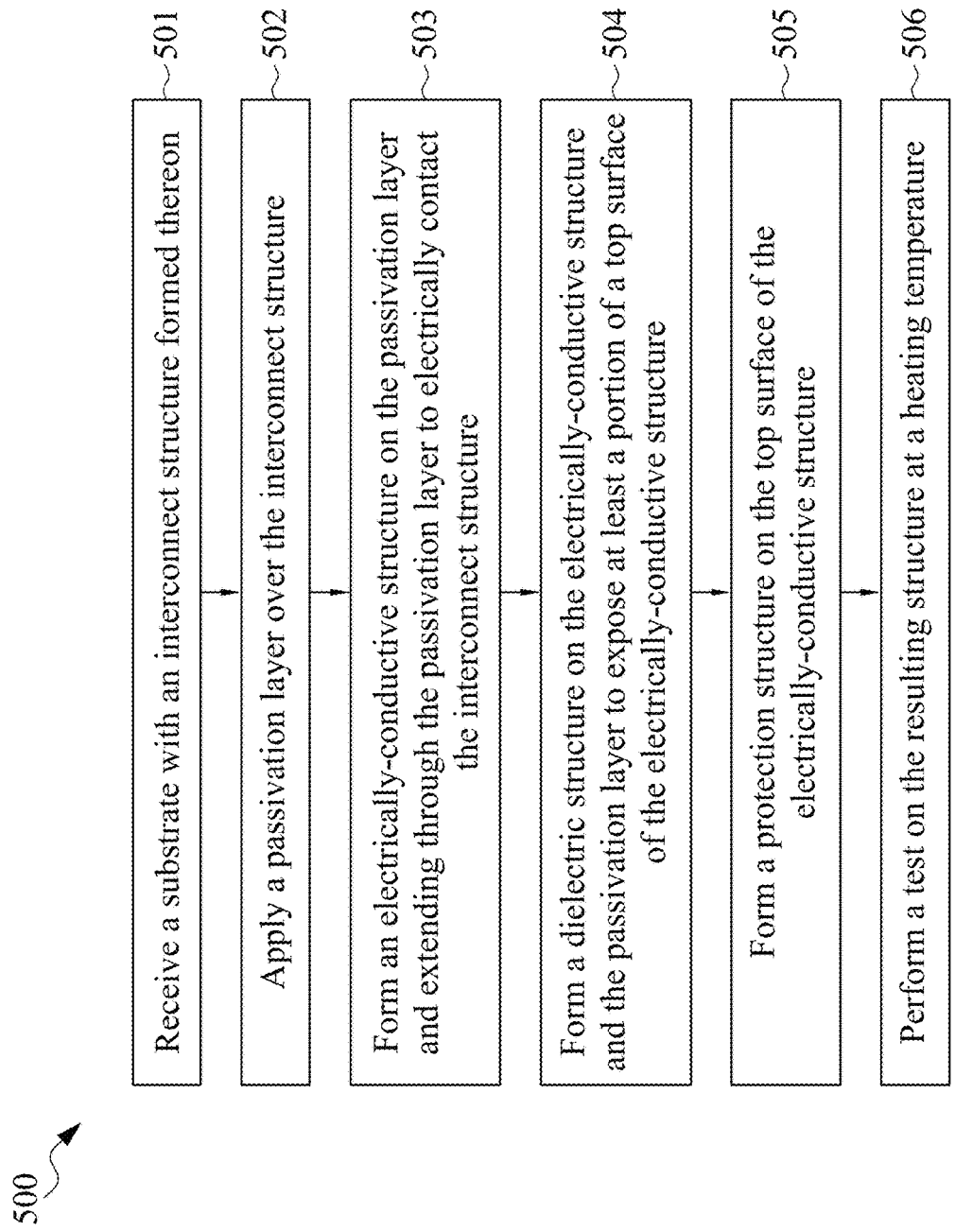
FIG. 10 is a flowchart of a method for forming a semiconductor structure according to various aspects of the present disclosure.

FIG. 10 is a flowchart representing a method 500 of manufacturing a package structure 200 according to various aspects of the present disclosure in accordance with some embodiments. In some embodiments, method 500 of manufacturing the package structure 200 includes a number of operations (501, 502, 503, 504, 505 and 506). Method 500 of manufacturing the package structure will be further described according to one or more embodiments. In FIGS. 11 to 15, 16A, 16B, 17A, 17B, 18, 19, 20A and 20B, the reference numerals will be given like those which have already been described above so as to omit the repetition of similar descriptions. In addition, portions about which no particular description will be made have the similar constructions to those of the semiconductor structure described above and provide the same advantages provided thereby. It should be noted that the operations of the method 500 may be rearranged or otherwise modified within the scope of the various aspects. It should further be noted that additional processes may be provided before, during, and after the method 500, and that some other processes may be only briefly described herein.

With reference to FIG. 10, method 500 for manufacturing a semiconductor structure comprises receiving or providing a substrate with an interconnect structure formed thereon 501; apply a passivation layer over the interconnect structure 502; forming an electrically-conductive structure on the passivation layer and extending through the passivation layer to electrically contact the interconnect structure 503; forming a dielectric structure on the electrically-conductive structure and the passivation layer to expose at least a portion of a top surface of the electrically-conductive structure 504; forming a protection structure on the top surface of the electrically-conductive structure 505; and performing a test on the resulting structure at a heating temperature 506.

Figure 11:
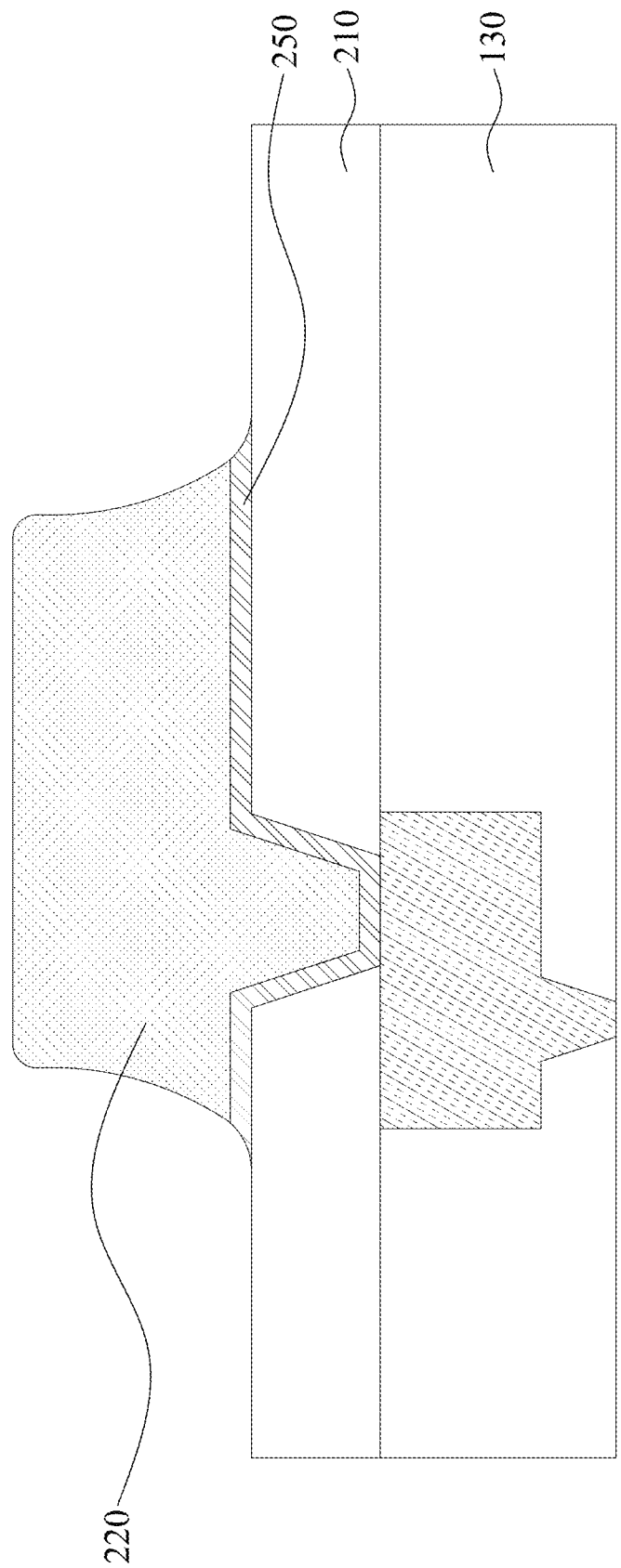
FIGS. 11 to 15, 16A, 16B, 17A, 17B, 18, 19, 20A and 20B illustrate cross-sectional side views of a semiconductor structure at various stages of fabrication, according to the method of FIG. 10, in accordance with some embodiments of the present disclosure.

With reference to FIG. 11, method 500 begins at operation 501 by receiving or providing a substrate on which an interconnect structure 130 is formed. The interconnect structure 130 may be a BEOL connecting structure as shown in FIGS. 1 and 2, but the disclosure is not limited thereto. FIGS. 11 to 20 merely illustrate a top metal interconnect layer, but the disclosure is not limited thereto.

At operations 502 and 503, a passivation layer 210 may be formed over the interconnect structure 130 and an electrically-conductive structure 220 can be formed on the passivation layer 210 and can extend through the passivation layer 210 to electrically contact the interconnect structure 130. In some embodiments, the electrically-conductive structure 220 can be formed by forming a trench in the passivation layer 210 to expose a portion of the interconnect structure 130; and applying an electrically-conductive material on the passivation layer 210 and filling the trench with the electrically-conductive material so as to form the electrically-conductive structure 220 including a lower portion 224 filling the trench and an upper portion 222 disposed on the lower portion 224 and covering a top surface of the passivation layer 210. Lithographic patterning and etching processes may be conducted to make the electrically-conductive structure 220 with a desired shape and to expose a portion of the top surface of the passivation layer 210. The electrically-conductive material can be made of a first metal with an oxidation temperature. In some embodiments, the first metal can be copper.

In some embodiment, before applying the electrically-conductive material, a first barrier layer 250 may be formed along the bottom and sidewall of the trench and formed on a top surface of the passivation layer 210. After the lithographic patterning and etching processes, the first barrier layer 250 may be disposed between the passivation layer 210 and the electrically-conductive structure 220 so a portion of the top surface of the passivation layer 210 is exposed. The first barrier layer 250 may comprise titanium (Ti), tantalum (Ta), titanium nitride (TiN), tantalum nitride (TaN), tungsten (W), other metal nitrides or a combination thereof.

Figure 12:
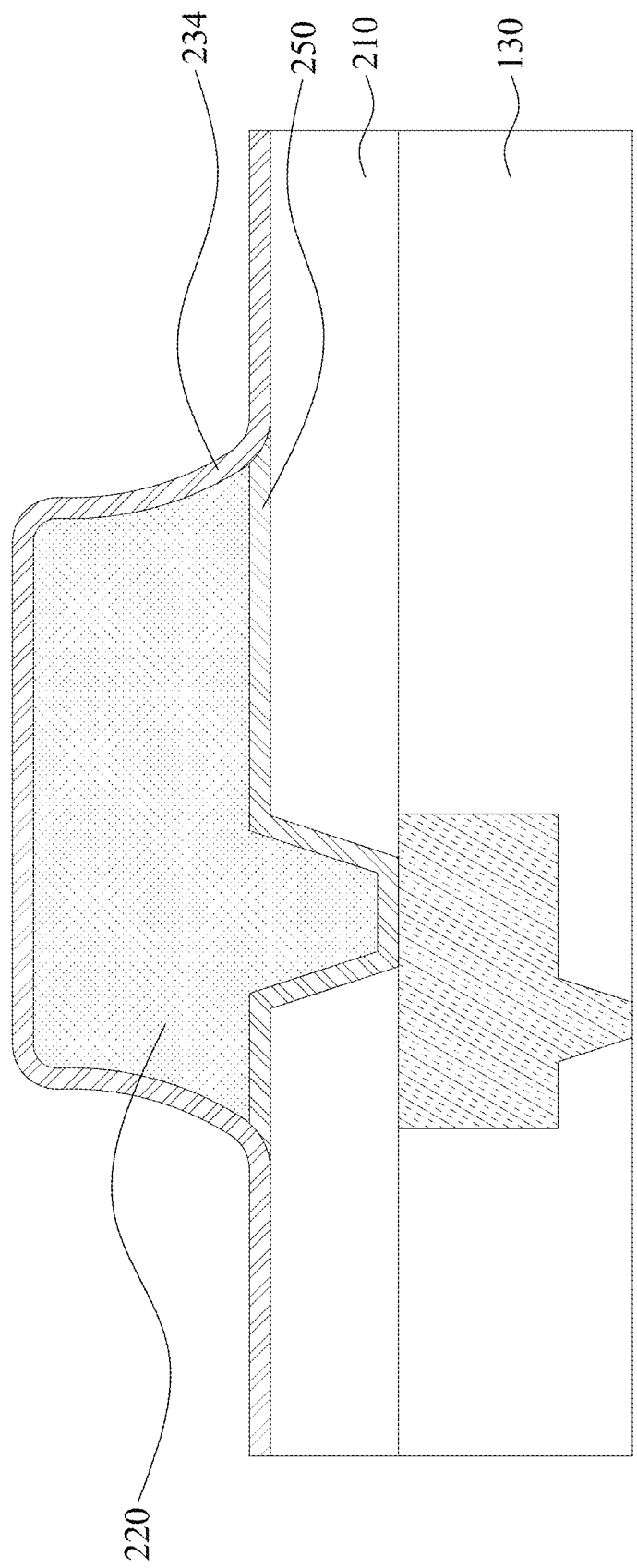
Figure 13:
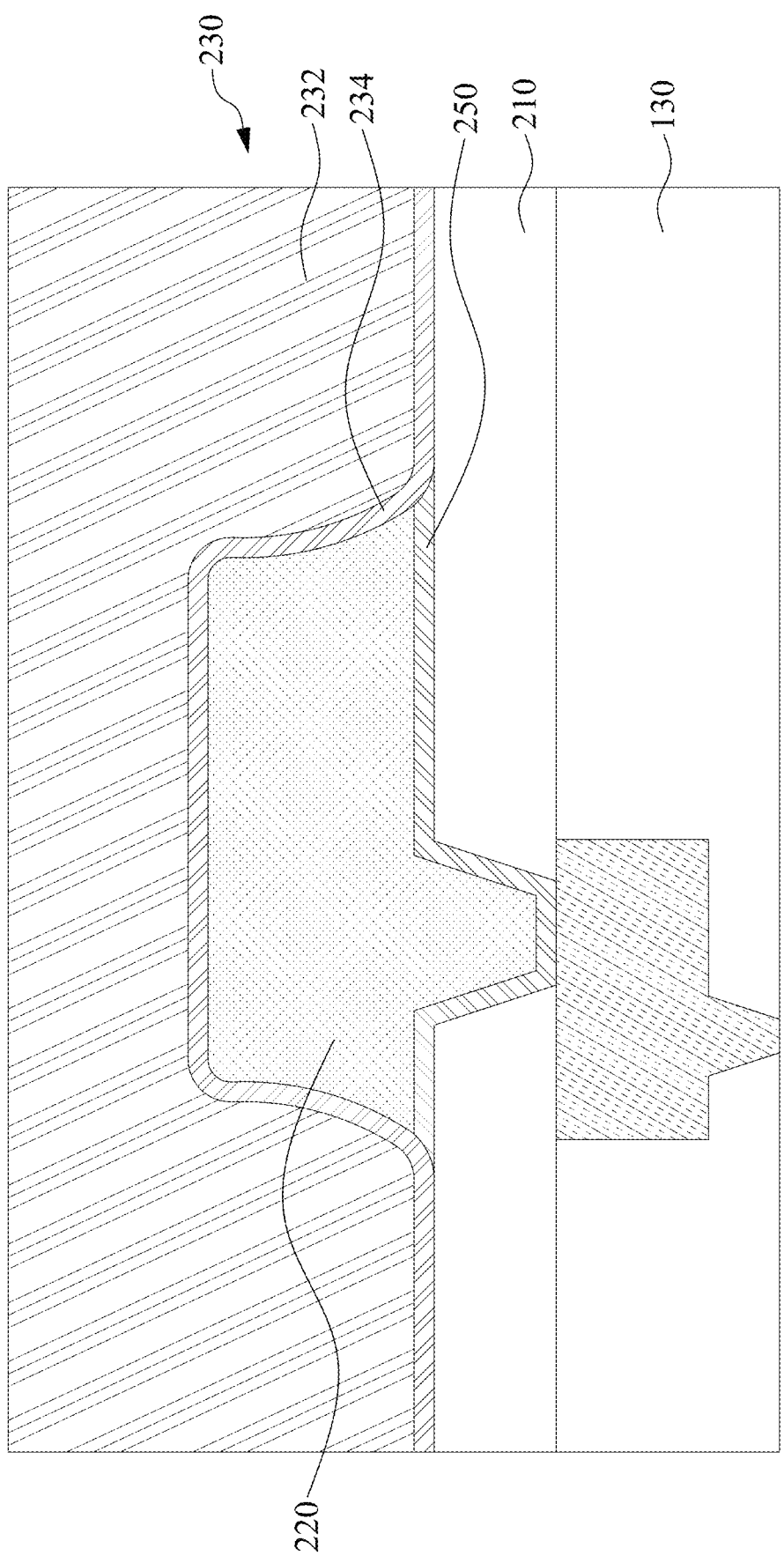
Figure 14:
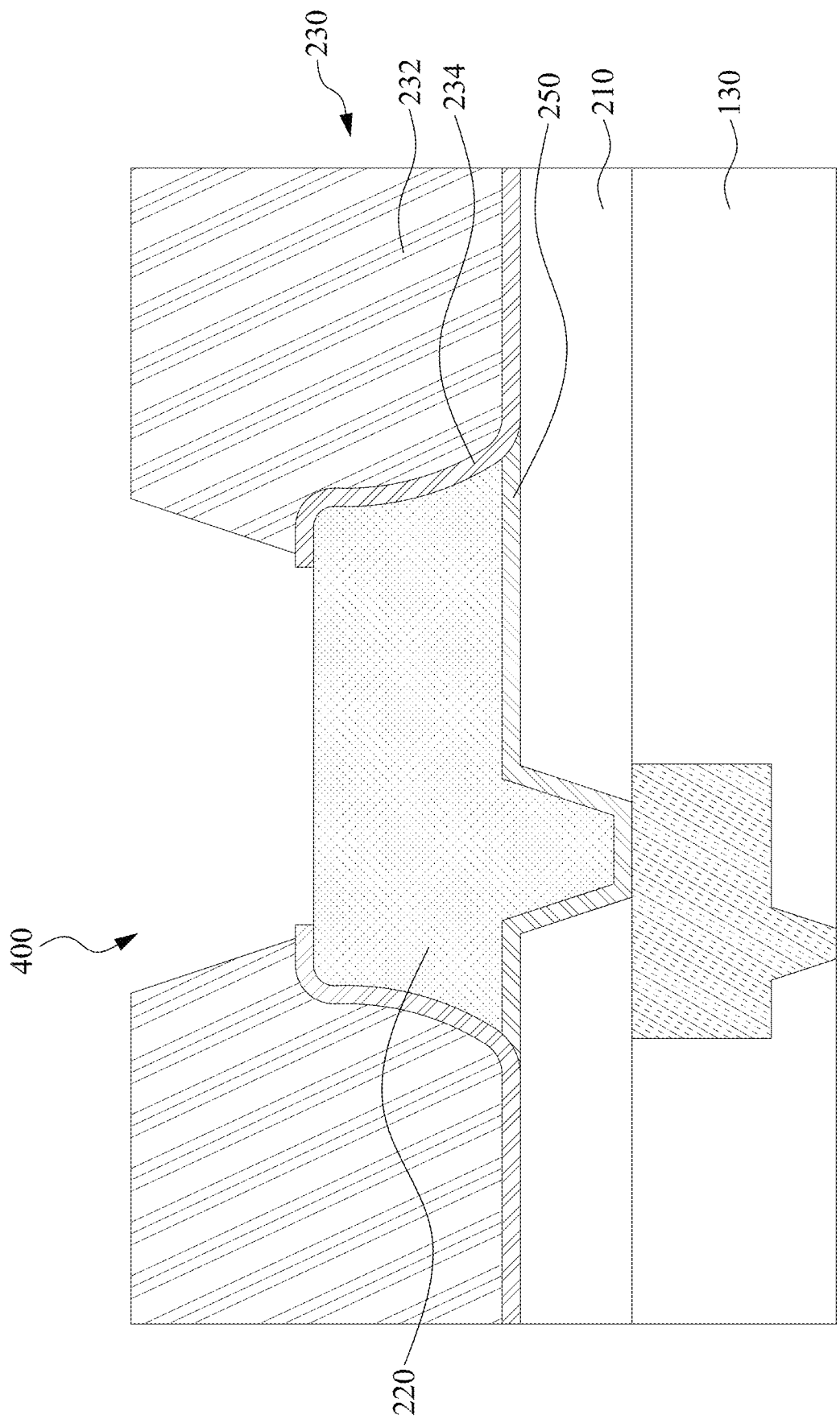

At operation 504, a dielectric structure 230 may be formed over the electrically-conductive structure 220 and the passivation layer 210 by applying a second dielectric layer 234 over the electrically-conductive structure 220 and the exposed portion of the top surface of the passivation layer 210, as shown in FIG. 12; and applying a first dielectric layer 232 over the second layer 234, as shown in FIG. 13. In FIG. 14, an etching process (for example, by using a dry etching and/or wet etching) may be performed to form an opening 400 so as to expose at least a portion of the top surface of the electrically-conductive structure 220. For example, the dry etching process may be performed with etchants, including oxygen-containing gas/plasma or other suitable gas/plasma, and/or its combination.

In some embodiments, the second dielectric layer 234 may be formed between the electrically-conductive structure 220 and the first dielectric layer 232. In some embodiments, due to different etch rates of the second dielectric layer 234 and the first dielectric layer 232, some portions of the second dielectric layer 234 may be exposed from the first dielectric layer 232. For example, as shown in FIG. 14, an edge of the second layer 234 can be exposed from the first dielectric layer 232. In other words, portions of the first dielectric layer 232 and portions of the second dielectric layer 234 may be exposed through sidewalls of the opening 400.

Figure 15:
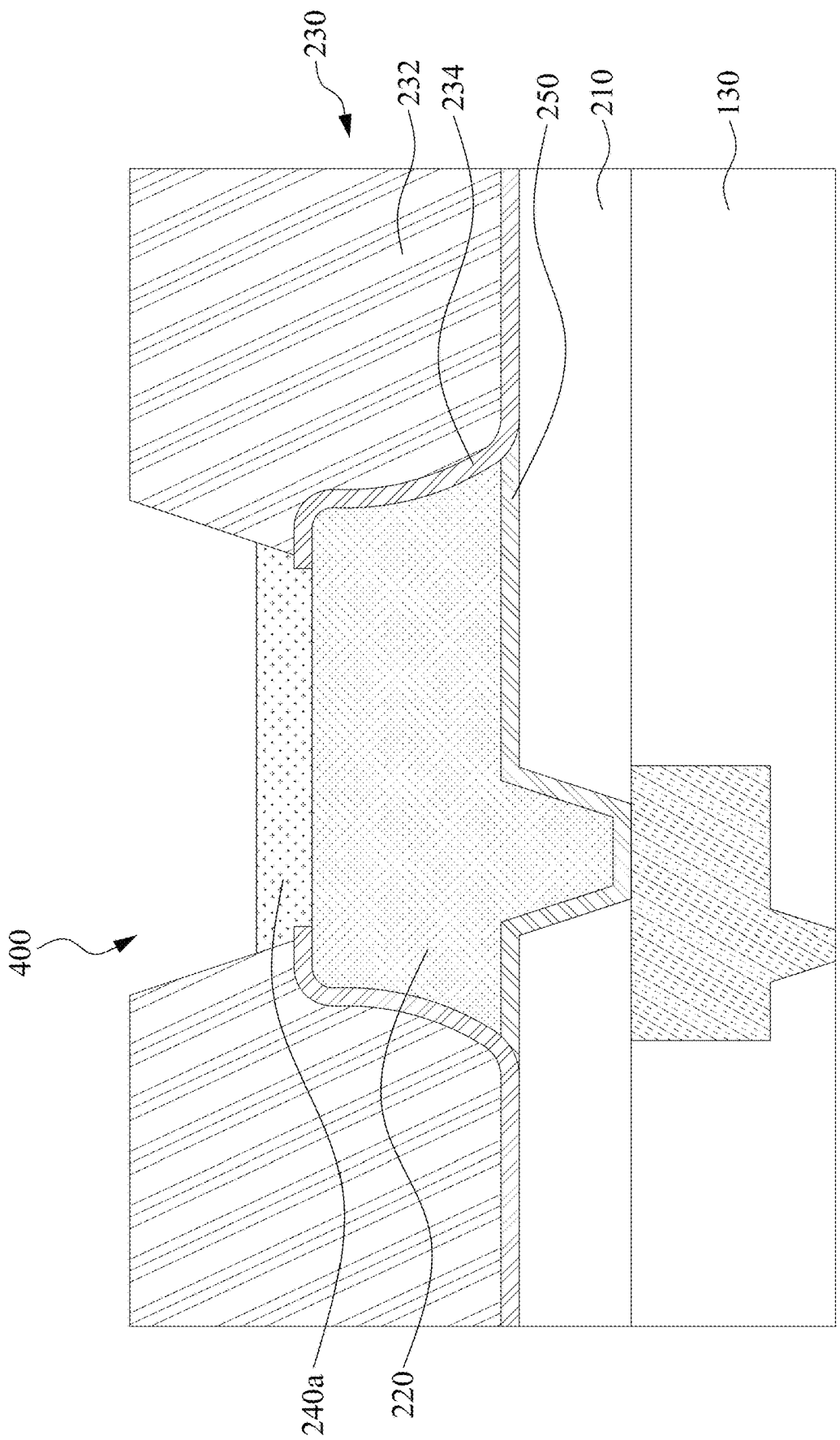

At operation 505, as shown in FIG. 15, in some embodiments, a protection structure 240a is formed on the top surface of the electrically-conductive structure 220 by applying a second metal in the opening 400 so the top surface of the electrically-conductive structure 220 is overlaid with the protection structure 240a. The application of the second metal may be formed through deposition, selective deposition, electroless plating or other processes for forming a metal layer. In some embodiments, the protection structure 240a may be a single-layer structure, which can be an aluminum (Al) layer, a nickel (Ni) layer, a palladium (Pd) layer, a golden (Au) layer, a tungsten (W) layer, a nickel-gold (NiAu) layer, an aluminum-copper (AlCu) layer and so on. For example, an aluminum (Al) layer may be deposited on the electrically-conductive structure 220, which may be made of copper, to form the protection structure 240a. In another embodiments, a tungsten (W) layer or a nickel-gold (NiAu) layer may form the protection structure 240a through selective deposition (such as chemical vapor deposition (CVD), low pressure chemical vapor deposition (LPCVD) and the like). In some embodiments, the protection structure 240 may comprise Al, Ni, AlCu, Au or a combination thereof, which are relatively soft than copper oxide and can increase contact area for probing needles and would improve the measurement stability during a test at operation 506 described below. In some embodiments, the protection structure 240 may comprise Al, AlCu, Au or a combination thereof, which would enhance an adhesion between the protection structure 240 and an external connection structure for wire-bonding. In some embodiments, a top surface of the protection structure 240a may be lower than the top surface of the first dielectric layer 232. In some embodiments, the edge of the polyimide layer 234 exposed from the first dielectric layer 232 may be overlaid with the protection structure 240a.

Figure 16A:
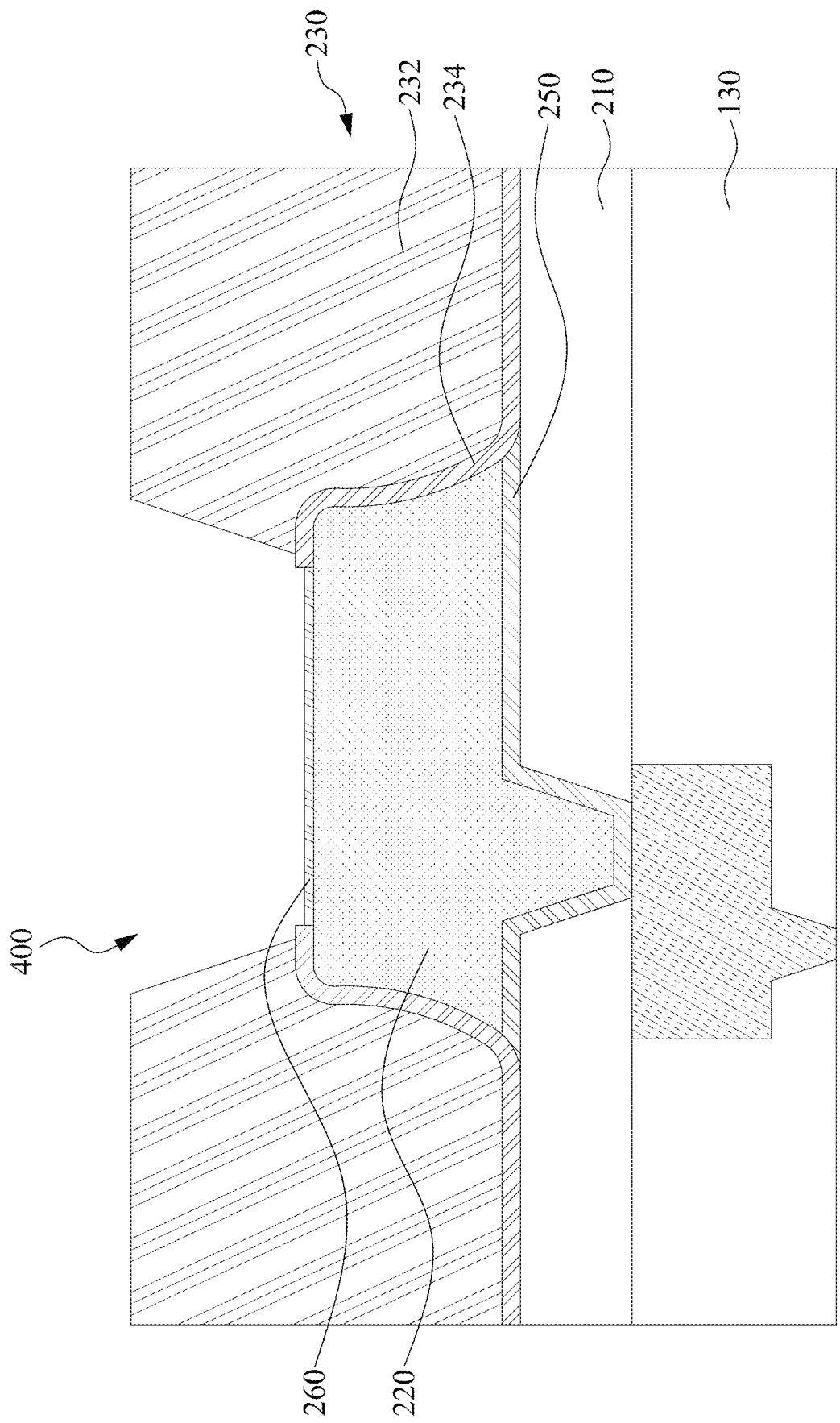
Figure 16B:
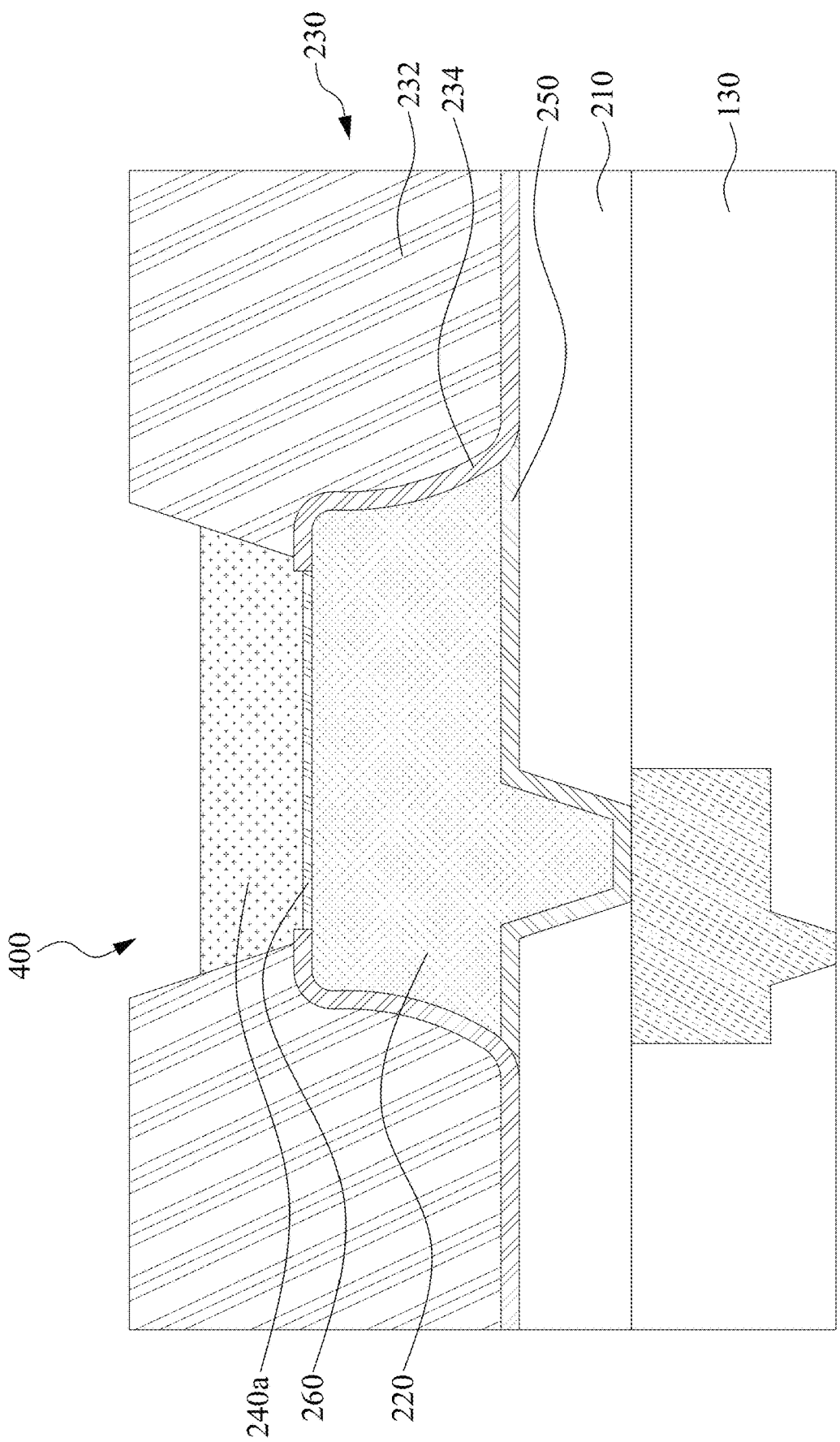

In some embodiments, a second barrier layer 260 may be formed in the opening 400 and formed on the electrically-conductive structure 220, as shown in FIG. 16A, and a protection structure 240a can be applied onto the second barrier layer 260 as shown in FIG. 16B. The second barrier layer 260 may comprise titanium (Ti), tantalum (Ta), titanium nitride (TiN), tantalum nitride (TaN), tungsten (W), other metal nitrides or a combination thereof. In some embodiments, the edge of polyimide layer 234 exposed from the first dielectric layer 232 may be overlaid with the second barrier layer 260. The first and second barrier layers 250 and 260 may reduce the migration of the atoms of the second metal (such as copper atoms) from the electrically-conductive structure 220.

Figure 17A:
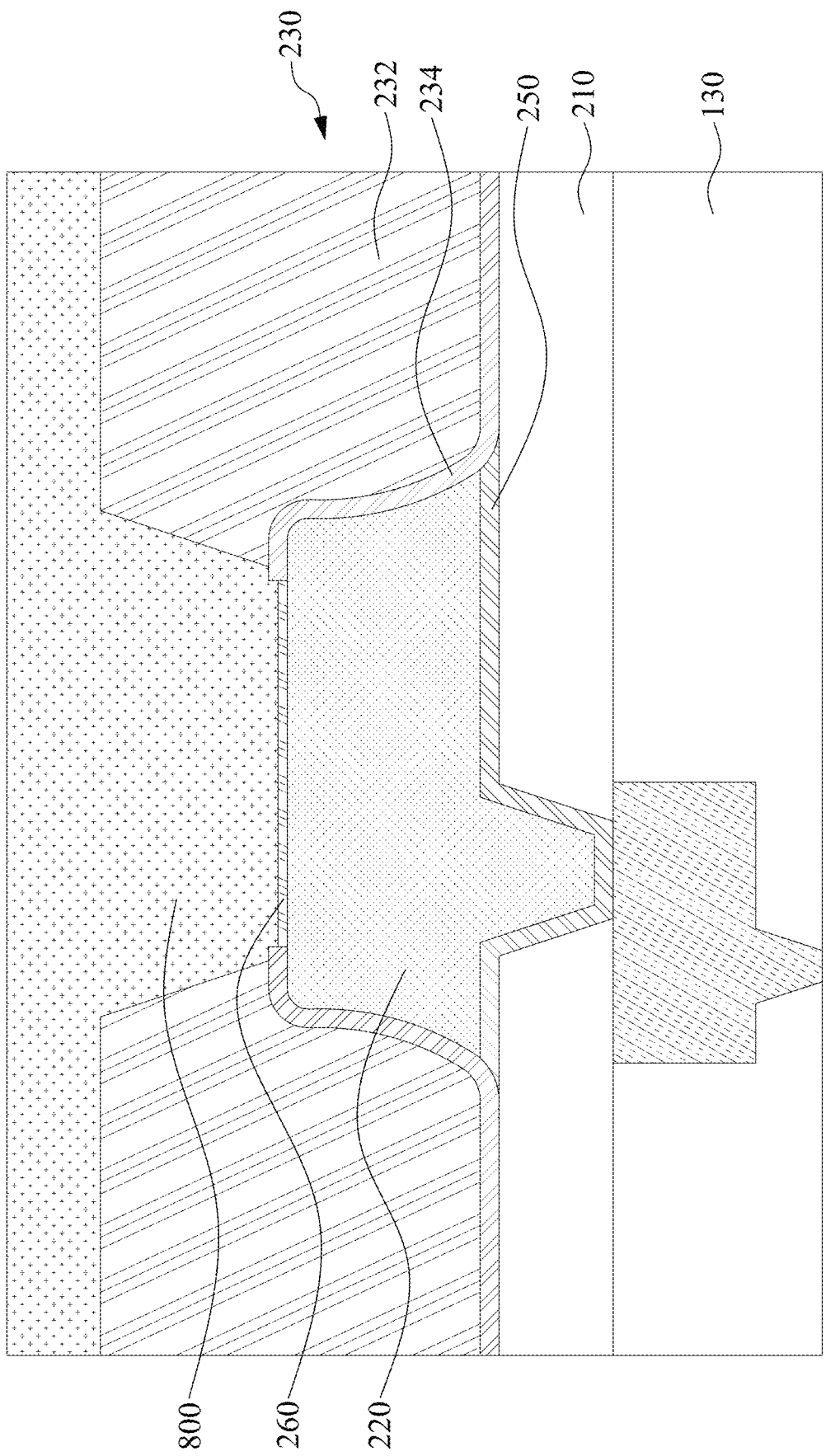
Figure 17B:
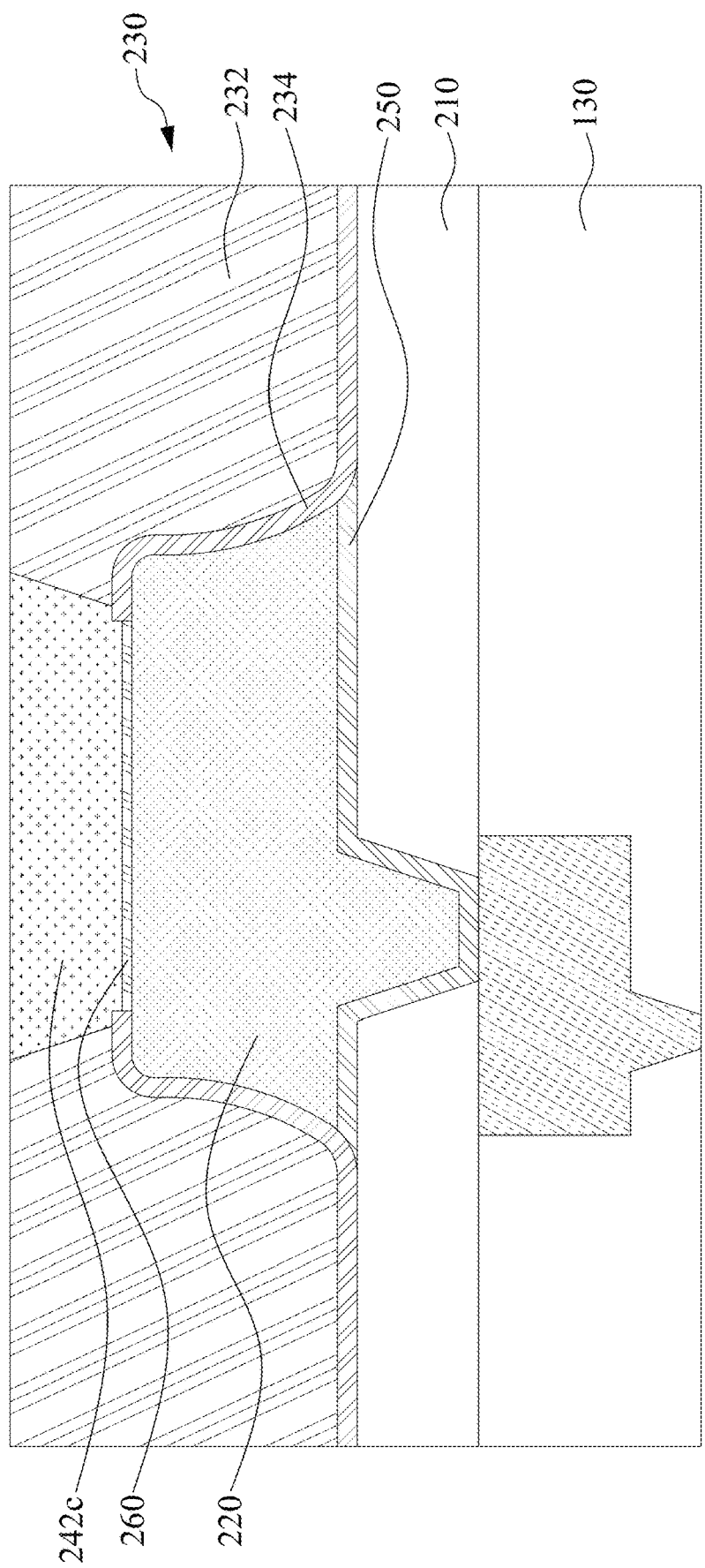

In some alternative embodiments, a protection structure 240b can be formed on the top surface of the electrically-conductive structure 220 by applying a second metal 800 in the opening 400 and also on the first dielectric layer 232, as shown in FIG. 17A; and performing a planarization, such as a chemical-mechanical planarization (CMP) to remove superfluous second metal from the first dielectric layer 232, as shown in FIG. 17B, so the top surface of the dielectric structure 230 is aligned with a top surface of the protection structure 240b.

Figure 18:
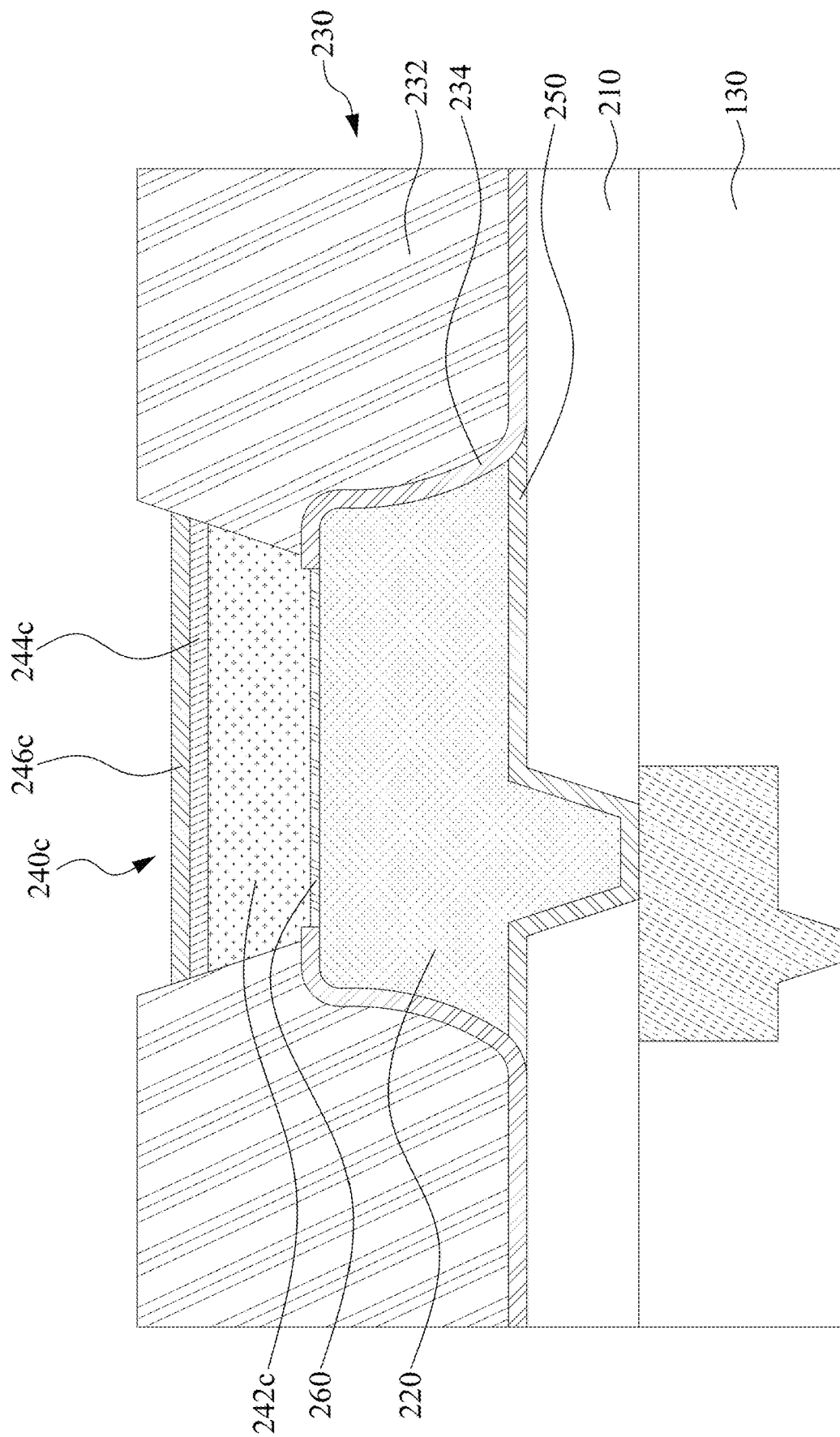

In some embodiments, as shown in FIG. 18, a protection structure 240c may be a multi-layer structure formed on the electrically-conductive structure 220 or on the second barrier layer 260. Such protection structure 240c may be formed by forming a first metal layer on the electrically-conductive structure 220 or on the second barrier layer 260, forming a second metal layer on the first metal layer, and so on, depending on the number of layers to be formed for building the protection structure 240c. In some embodiments, forming the protection structure 240c may comprise forming a nickel (Ni) layer 242c over the electrically-conductive structure 220 or over the second barrier layer 260, depositing a palladium (Pd) layer 244c on the Ni layer 242c, and depositing a golden (Au) layer 246c on the Pd layer 244c. Each of the Ni layer 242c, the Pd layer 244c and the Au layer 246c may be formed through electroless plating. Various combinations of metal layers may also be applied in the present disclosure to form the multi-layer protection structure 240c. The top surface of such multi-layer protection structure 240c may be lower than the top surface of the first dielectric layer 232.

Figure 19:
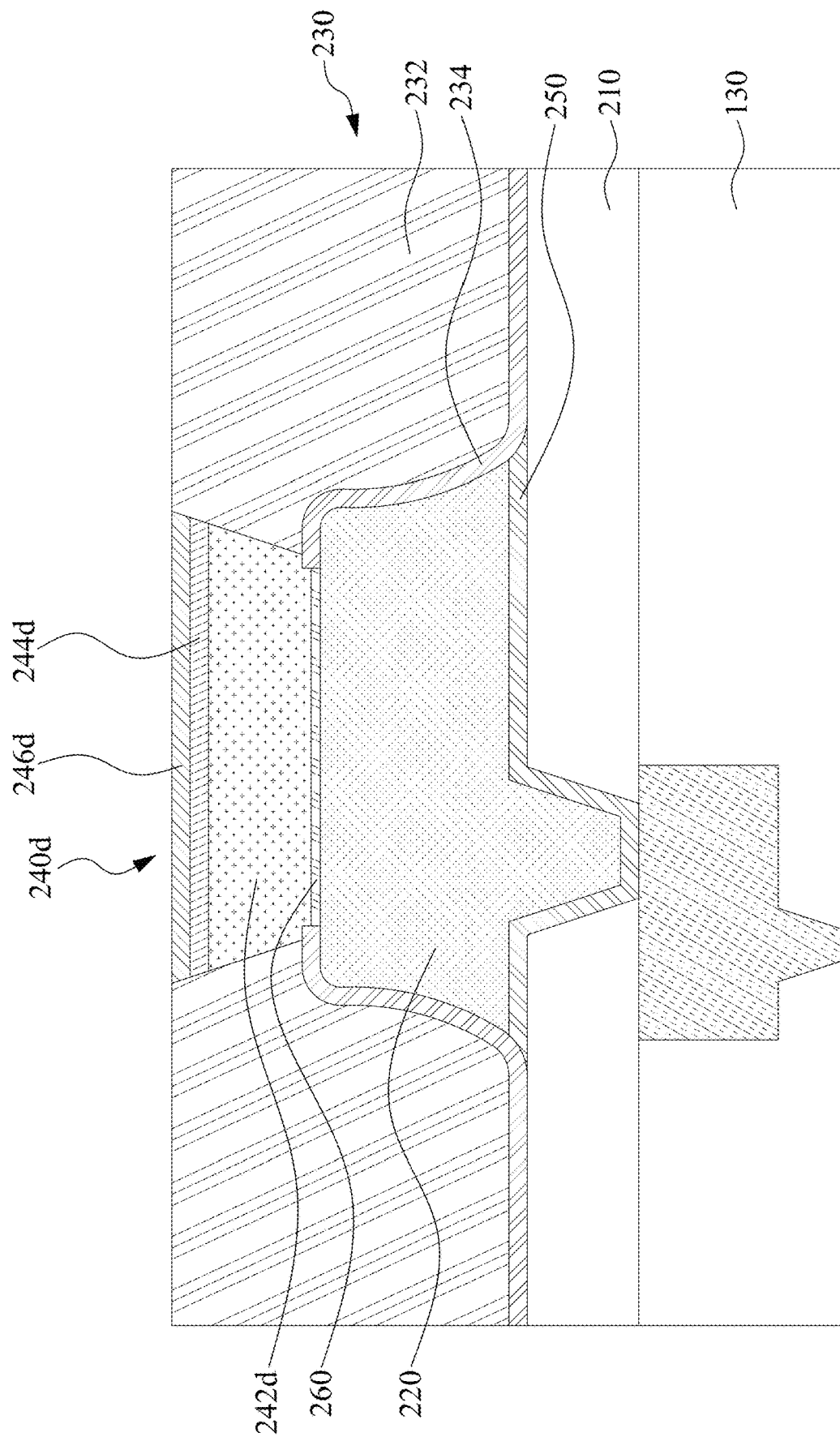

In some embodiments, as shown in FIG. 19, a protection structure 240d may be a multi-layer structure formed on the electrically-conductive structure 220 or on the second barrier layer 260. The top surface of such multi-layer protection structure 240d may be aligned with the top surface of the first dielectric layer 232.

Figure 20A:
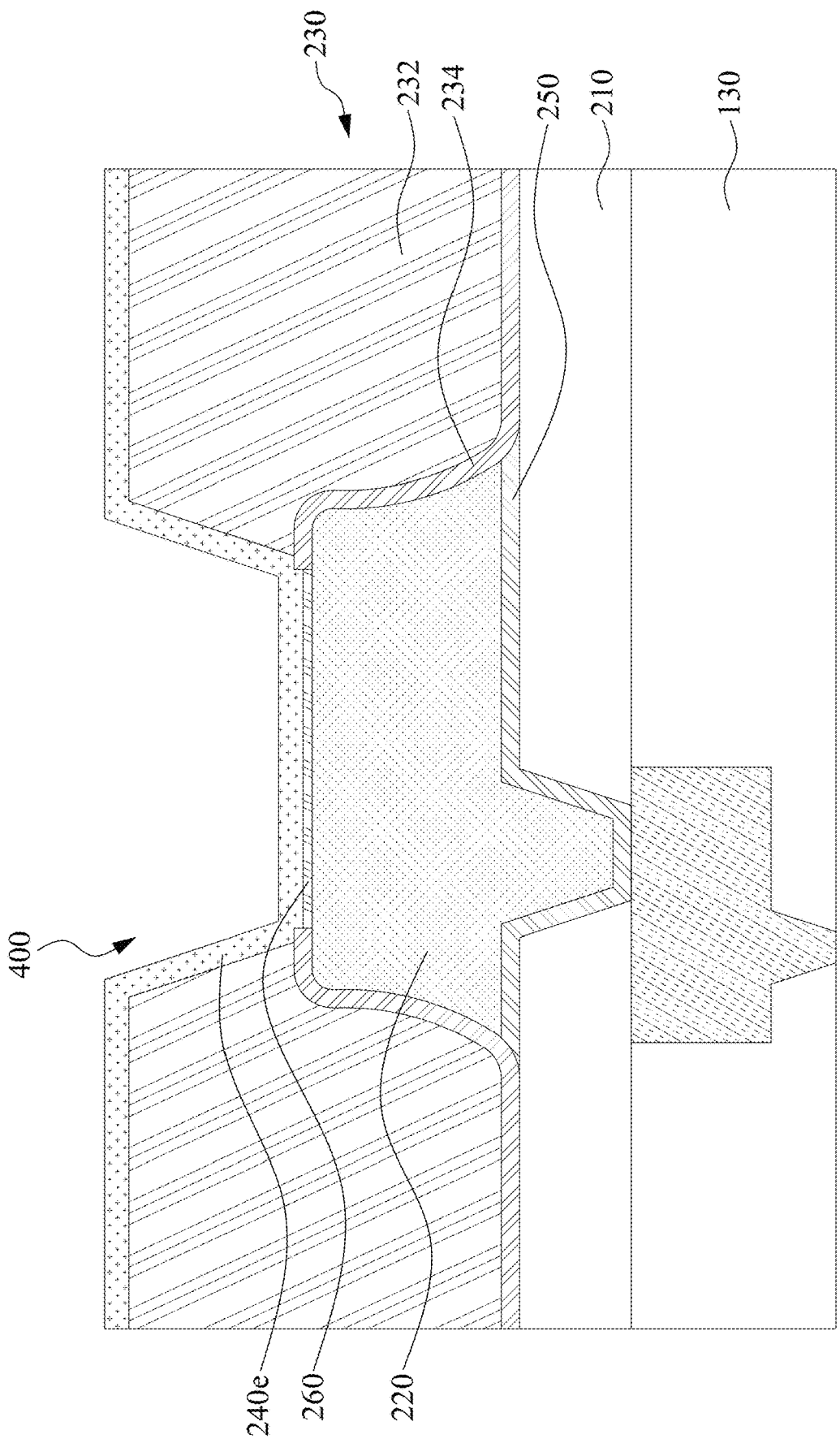
Figure 20B:
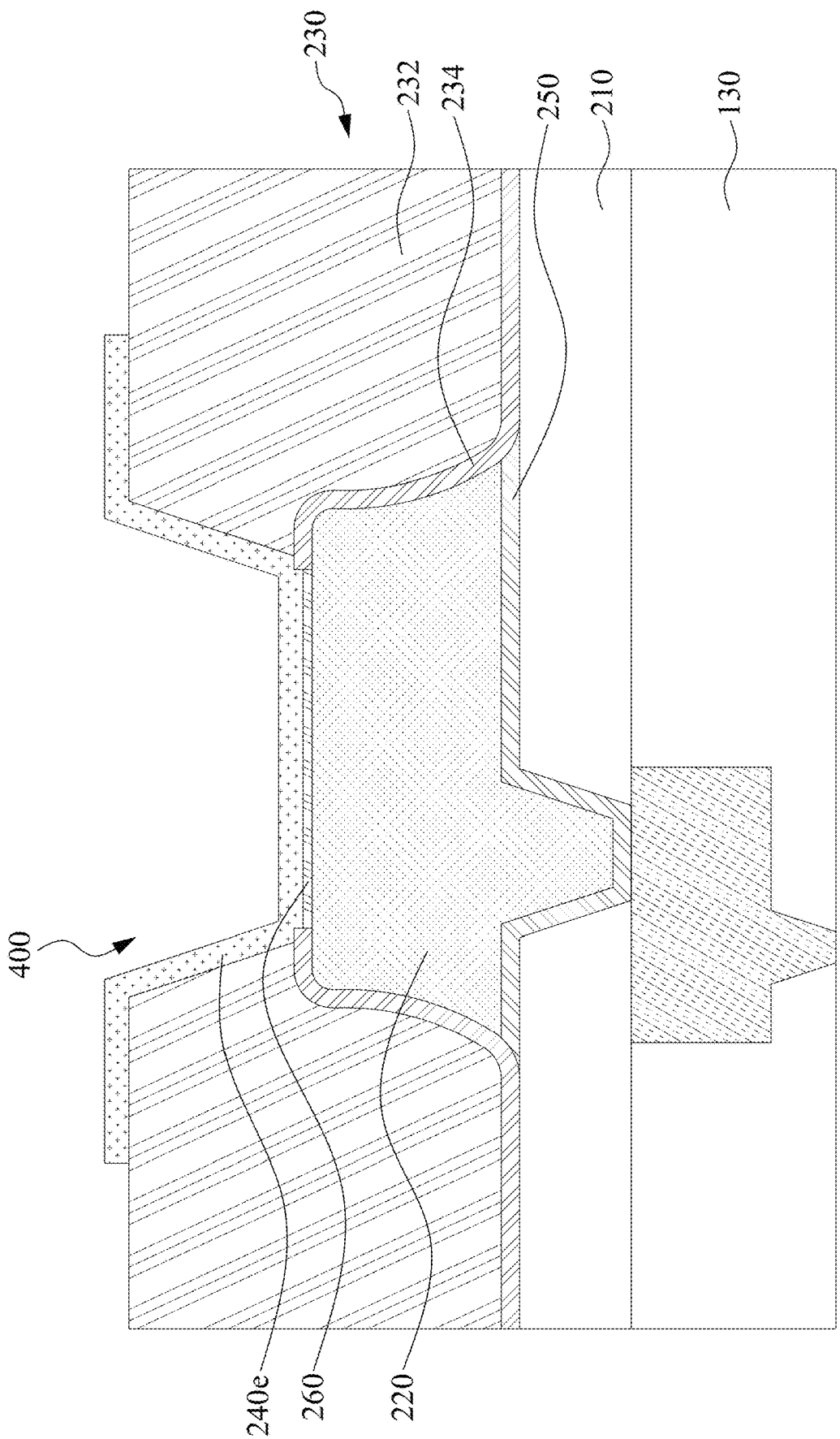

In some embodiments, a protection structure 240e can be formed on the top surface of the electrically-conductive structure 220 by applying a second metal along bottom and sidewall of the opening 400 and the top surface of the first dielectric layer 232, as shown in FIG. 20A; and performing an etching process to remove some portion of the second metal on the top surface of the first dielectric layer 232, as shown in FIG. 20B. In some embodiments, the bottom surface of the protection structure 240e may abut the top surface of the electrically-conductive structure 220 or abut the second barrier layer 260, as shown in FIG. 20B.

In the present disclosure, the protection structure 240 may have various embodiments, such as protection structures 240a, 240b, 240c, 240d and 240e, but the disclosure is not limited thereto. The protection structure 240 may be made of a second metal 800 with an oxidation temperature. The oxidation temperature of the second metal 800 of the protection structure 240 may be higher than that of the first metal of the electrically-conductive structure 220. The term "oxidation temperature" used in the present disclosure indicates the temperature at which a material begins to oxidize.

At operation 506, a test on the semiconductor structure may be performed at a heating temperature to test the reliability of the semiconductor structure. In some embodiments, the oxidation temperature of the second metal of the protection structure 240 is higher than the heating temperature. In some embodiments, the heating temperature may range from about 175° C. to about 350° C. In some embodiments, the oxidation temperature of the second metal may be lower than about 300° C. In some embodiments, the oxidation temperature of the second metal may be lower than about 200° C. In some embodiments, the oxidation temperature of the second metal may be lower than about 175° C.

Since the protection structure 240 is reluctant to be oxidized, it can provide an efficient protection from oxidation of the electrically-conductive structure 220, so measurability and measurement stability can be improved and the following wire bonding process can run smoothly. Furthermore, the protection structure 240 may also increase queuetime (Q-time) from one process to another, providing flexibility of time arrangement of process flow.

After the operation 506, an external connection structure may be formed on the protection structure 240 as shown in FIGS. 1 and 2. In some embodiments, the external connection structure may comprise an under bump metallization (UBM) structure 310 and a presolder 320 as shown in FIG. 1. In some embodiments, the external connection structure may comprise a wire bond 330 for wire boding or wedge bonding as shown in FIG. 2.

Figure 21:
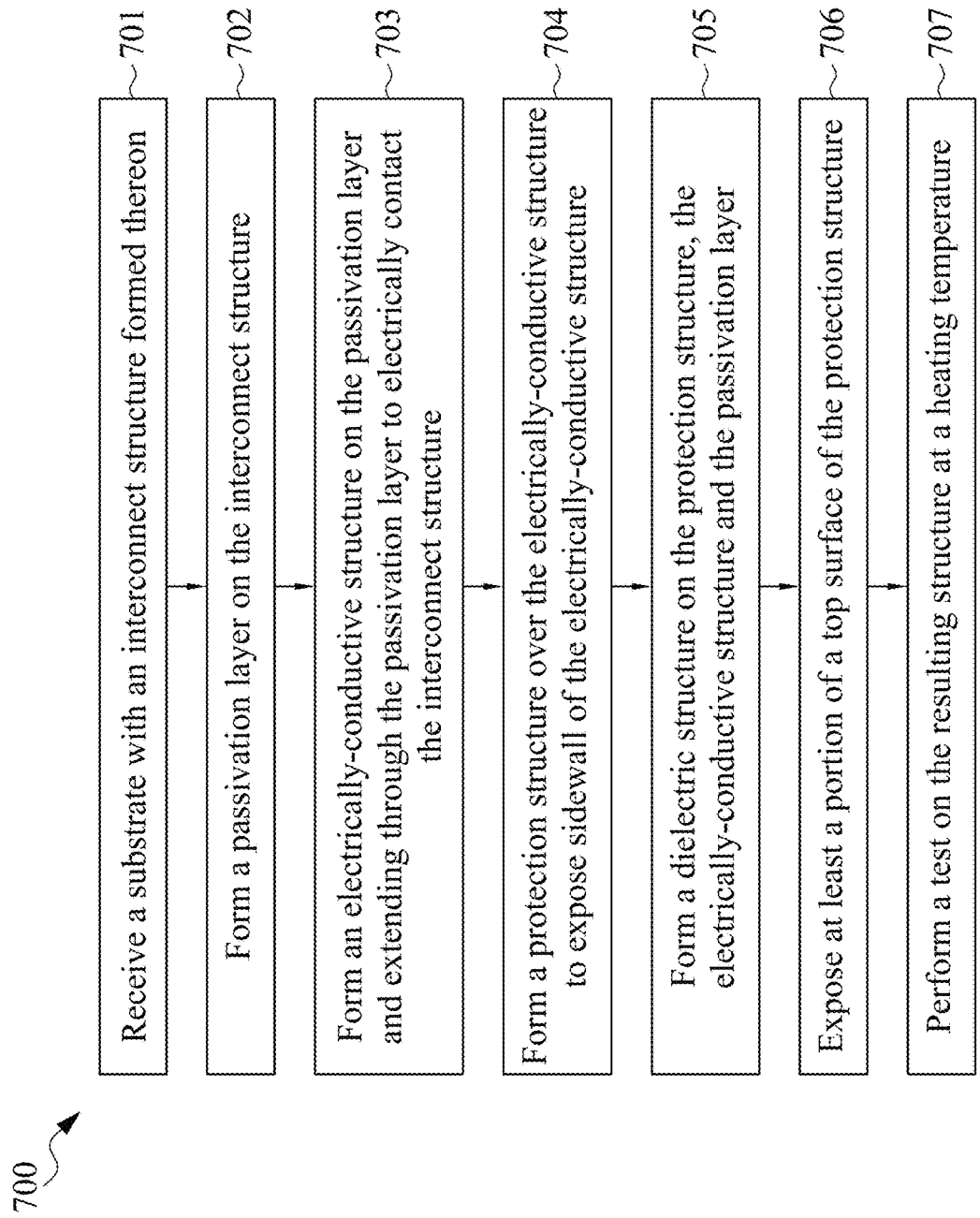
FIG. 21 is a flowchart of a method for forming a semiconductor structure according to various aspects of the present disclosure.

FIG. 21 is a flowchart representing a method 700 of manufacturing a package structure 200 according to various aspects of the present disclosure in accordance with some embodiments. In some embodiments, the method 700 of manufacturing the package structure 200 includes a number of operations (701, 702, 703, 704, 705, 706 and 707). Method 700 of manufacturing the package structure will be further described according to one or more embodiments. In FIGS. 22, 23A, 23B, 24A, 24B, 25A, 25B, 26A, 26B, 27A, 27B, 28A, 28B, 29 and 30, the reference numerals will be given like those which have already been described above so as to omit the repetition of similar descriptions. In addition, portions about which no particular description will be made have the similar constructions to those of the semiconductor structure described above and provide the same advantages provided thereby. It should be noted that the operations of the method 700 may be rearranged or otherwise modified within the scope of the various aspects. It should be further noted that additional processes may be provided before, during, and after the method 700, and that some other processes may be only briefly described herein.

With reference to FIG. 21, method 700 for manufacturing a semiconductor structure comprises receiving or providing a substrate with an interconnect structure formed thereon 701; apply a passivation layer over the interconnect structure 702; forming an electrically-conductive structure on the passivation layer and extending through the passivation layer to electrically contact the interconnect structure 703; forming a protection structure over the electrically-conductive structure to expose sidewall of the electrically-conductive structure 704; forming a dielectric structure on the protection structure, the electrically-conductive structure and the passivation layer 705; exposing at least a portion of a top surface of the protection structure 706; and performing a test on the resulting structure at a heating temperature 707.

Figure 22:
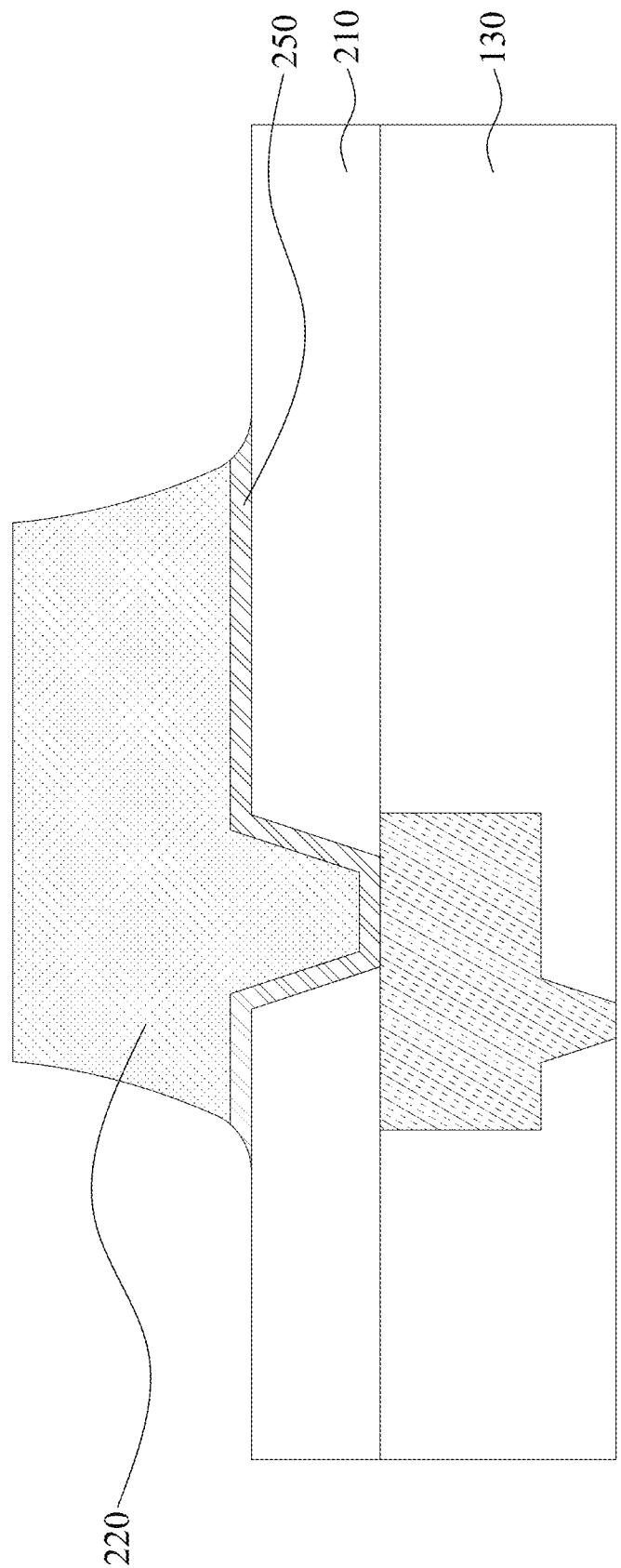
FIGS. 22, 23A, 23B, 24A, 24B, 25A, 25B, 26A, 26B, 27A, 27B, 28A, 28B, 29 and 30 illustrate cross-sectional side views of a semiconductor structure at various stages of fabrication, according to the method of FIG. 21, in accordance with some embodiments of the present disclosure.

With reference to FIG. 22, method 700 begins at operation 701 by receiving or providing a substrate on which an interconnect structure 130 is formed. The interconnect structure 130 may be a BEOL connecting structure as shown in FIGS. 1 and 2, but the disclosure is not limited thereto. FIGS. 22 to 30 merely illustrate a top metal interconnect layer, but the disclosure is not limited thereto.

Operations 702 and 703 can be similar to operations 502 and 503, a passivation layer 210 can be formed over the interconnect structure 130 and an electrically-conductive structure 220 can be formed on the passivation layer 210 and can extend through the passivation layer 210 to electrically contact the interconnect structure 130. The electrically-conductive material can be made of a first metal with an oxidation temperature. In some embodiments, the first metal can be copper. Furthermore, a first barrier layer 250 can be formed between the passivation layer 210 and the electrically-conductive structure 220. Repeated descriptions of such details are omitted for brevity.

Figure 23A:
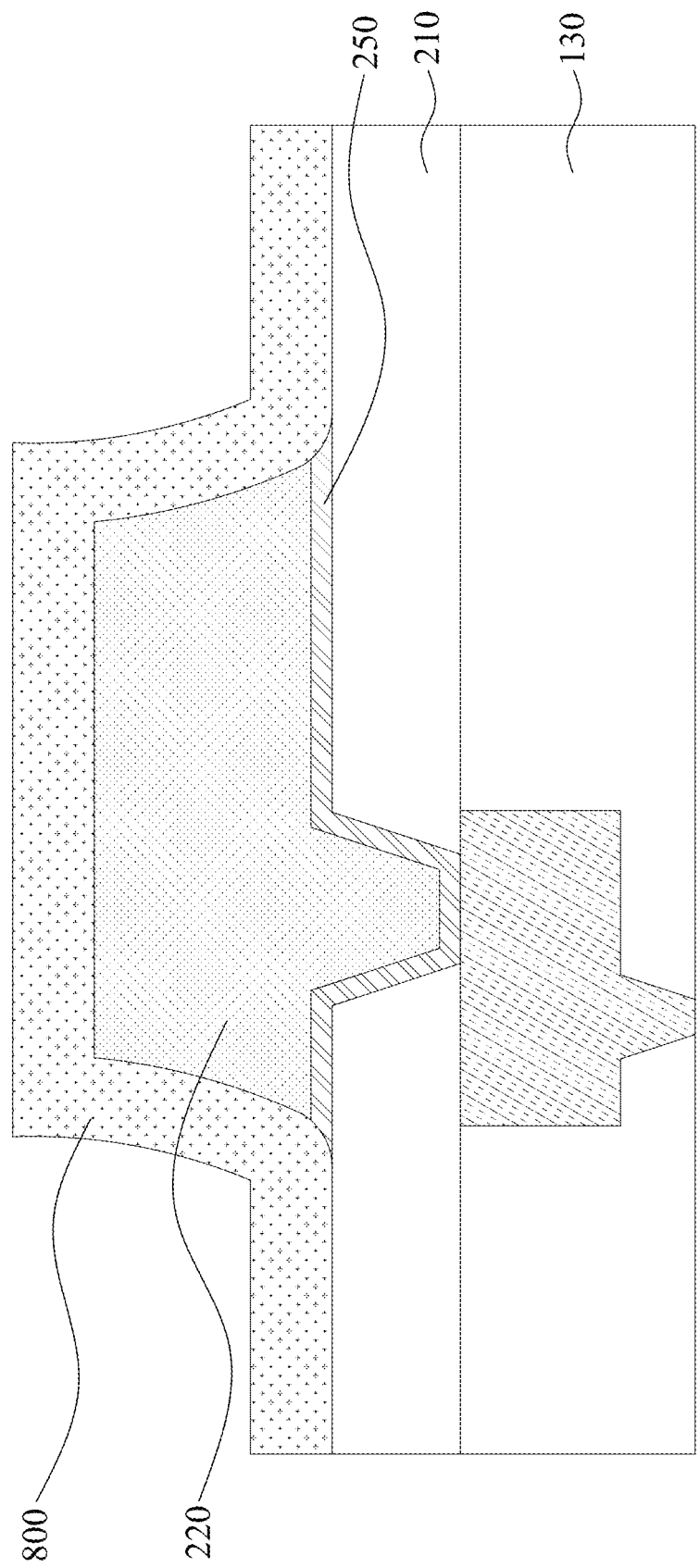
Figure 23B:
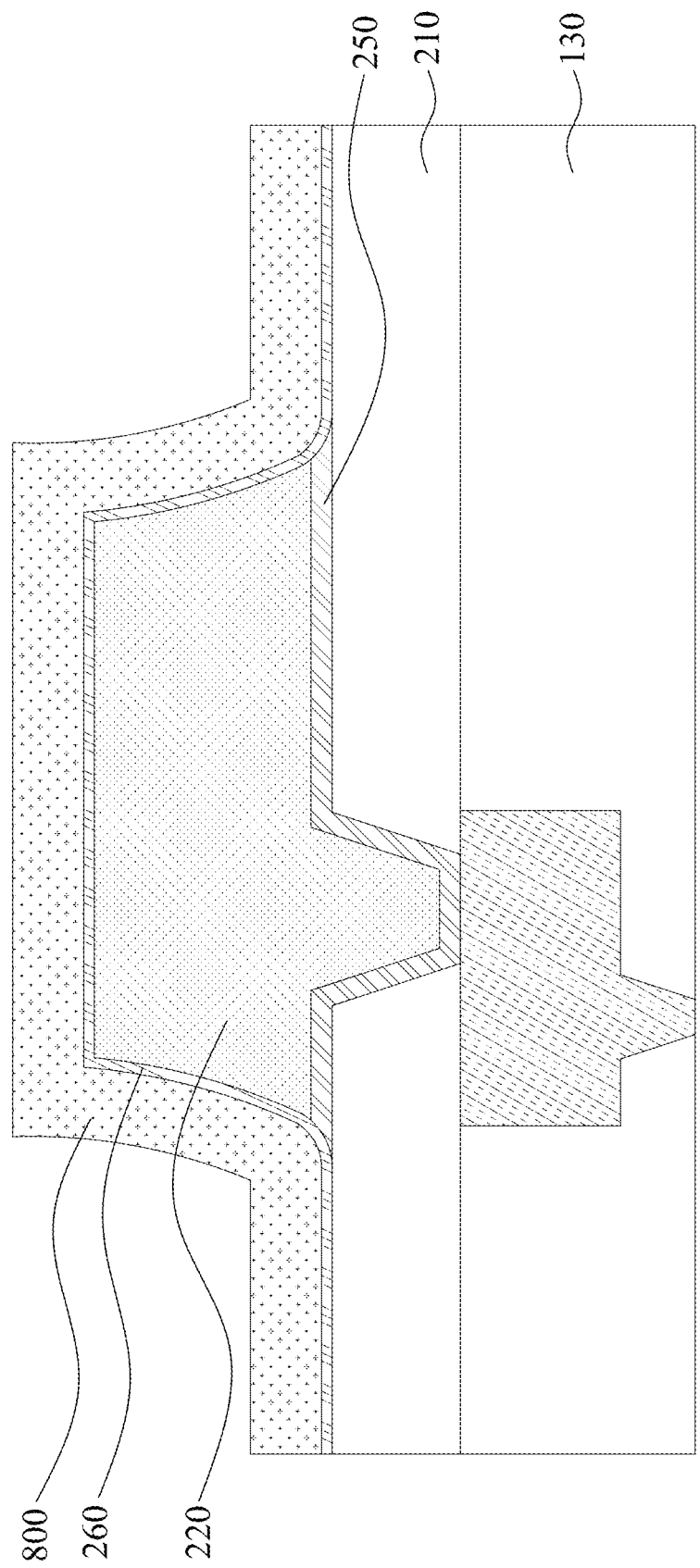
Figure 24A:
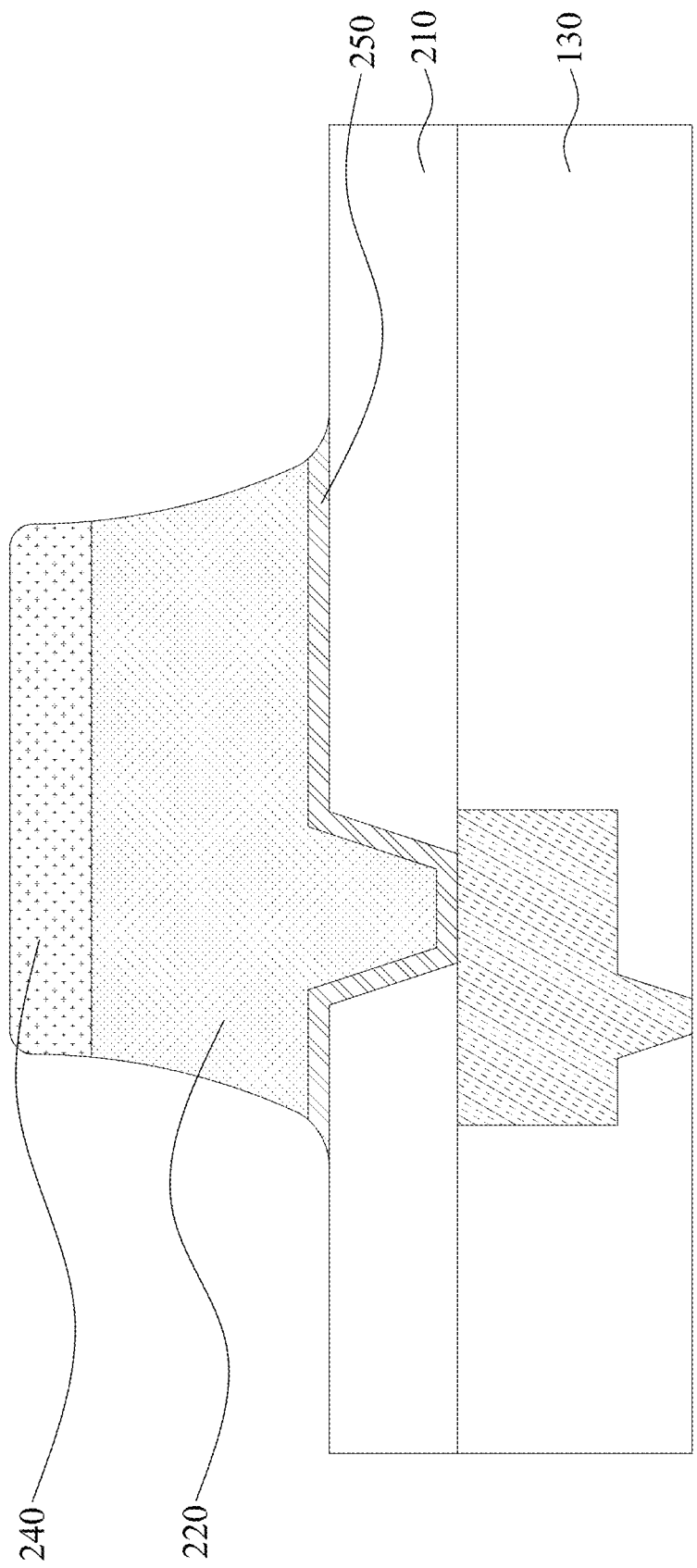

At operation 704, with reference to FIGS. 23A to 24B, a protection structure 240 may be formed by applying a second metal 800 over the electrically-conductive structure 220 and the top surface of the passivation layer 210, as shown in FIG. 23A; and performing an etching process to expose sidewall of the electrically-conductive structure 220 and the top surface of the passivation layer 210, as shown in FIG. 24A. The second metal 800 remained on the electrically-conductive structure 220 serves as the protection structure 240. In some embodiments, as shown in FIGS. 23A and 24A, the bottom surface of the protection structure 240 may abut the top surface of the electrically-conductive structure 220. The second metal has an oxidation temperature, which may be higher than the oxidation temperature of the first metal of the electrically-conductive structure 220.

Figure 24B:
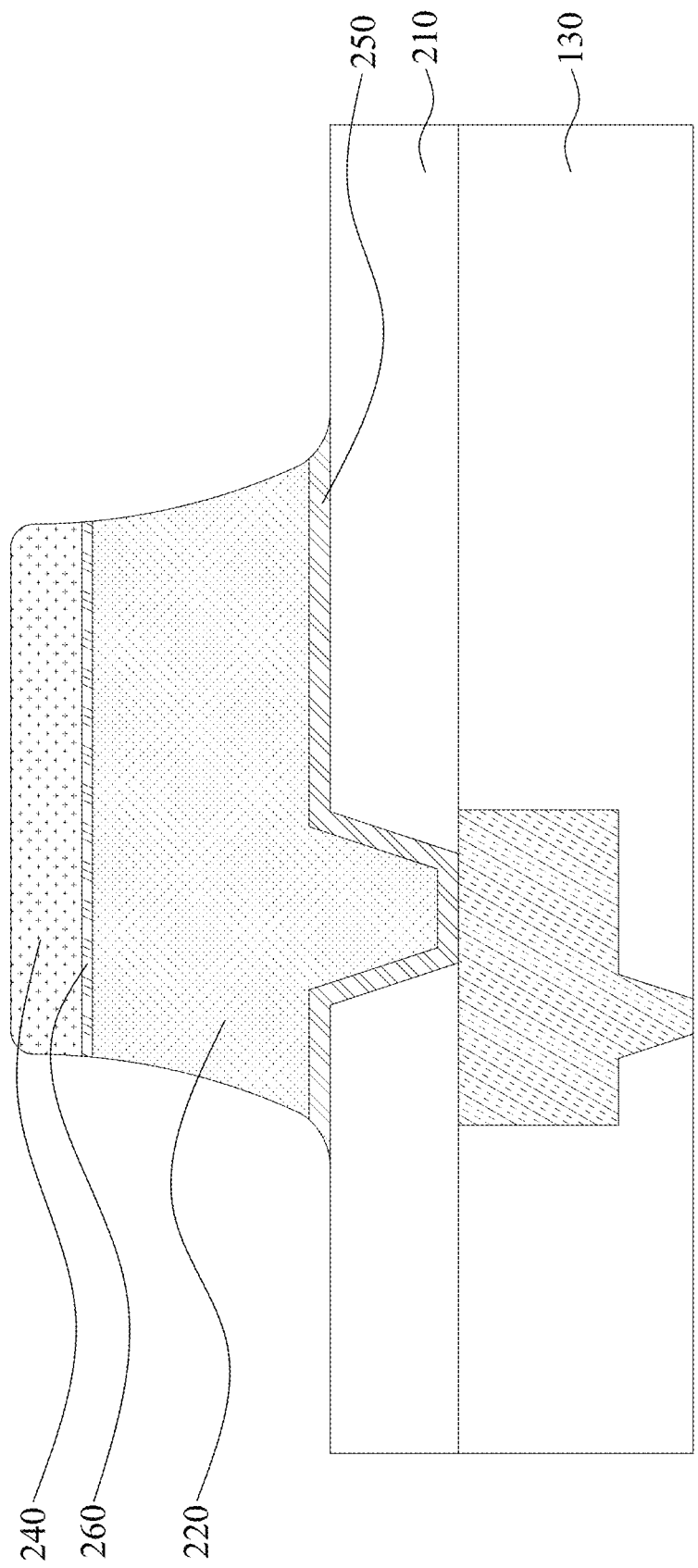

In some alternative embodiments, a protection structure 240 may be formed by applying a second barrier layer 260 over the electrically-conductive structure 220 and the top surface of the passivation layer 210; and applying a second material 800 over the second barrier layer 260, as shown in FIG. 23B; and performing an etching process to expose sidewall of the electrically-conductive structure 220 and the top surface of the passivation layer 210, as shown in FIG. 24B.

Figure 25A:
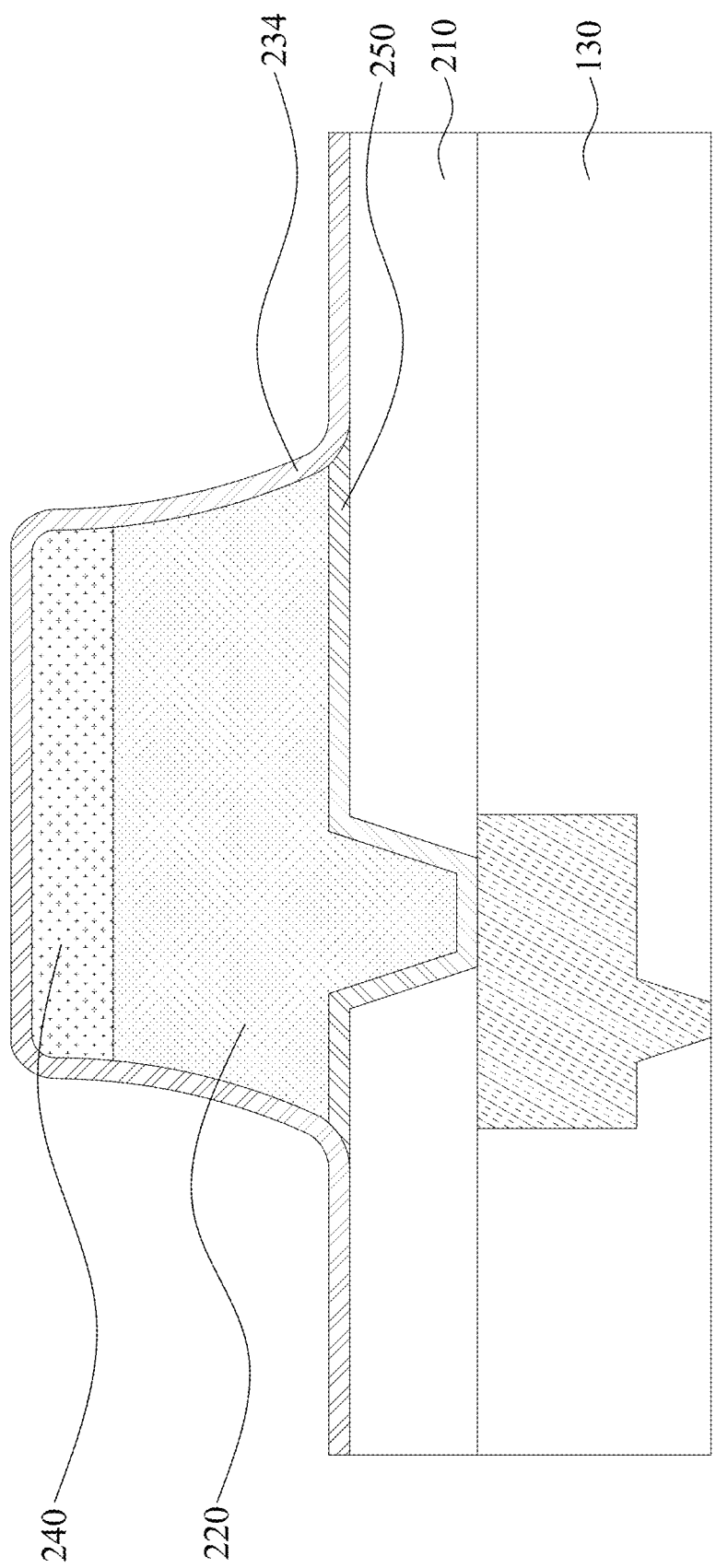
Figure 25B:
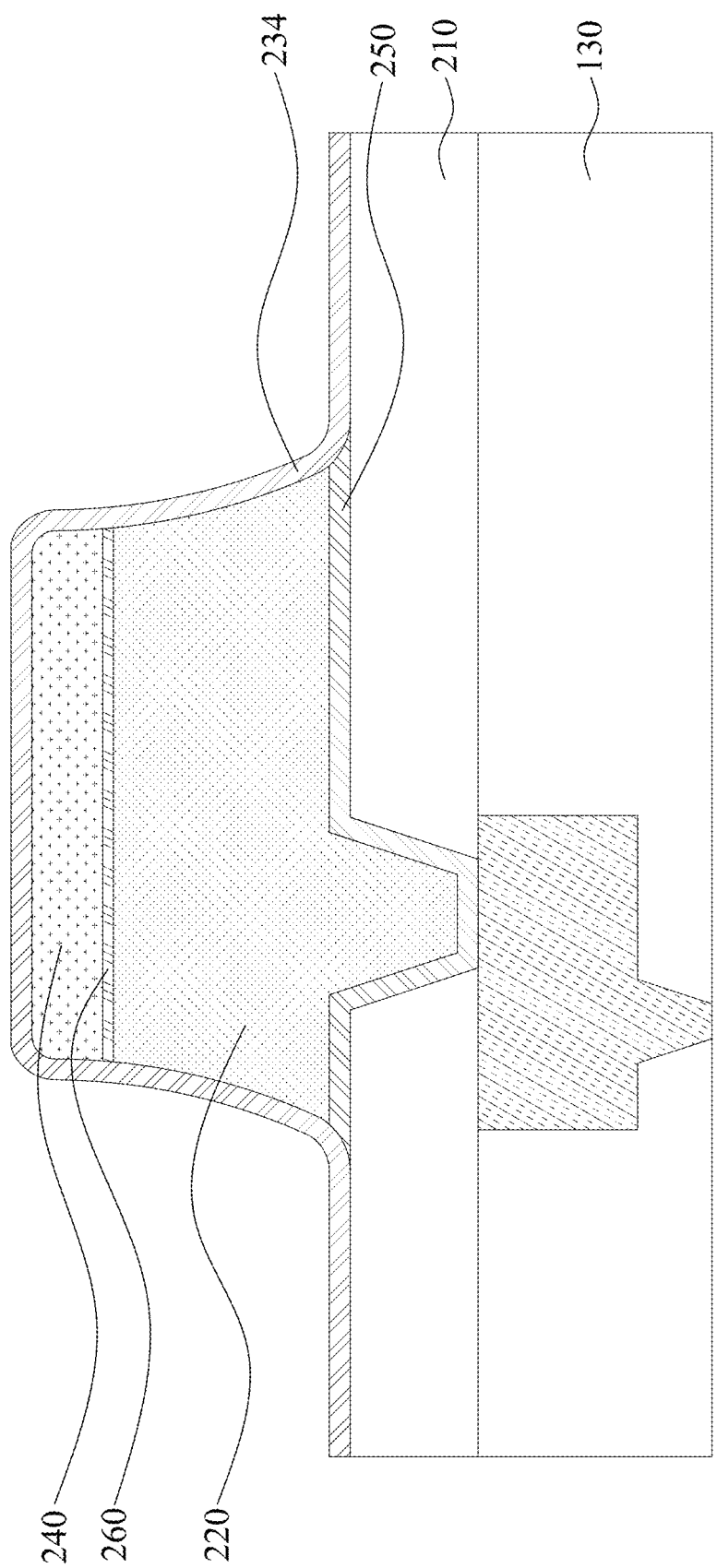
Figure 26A:
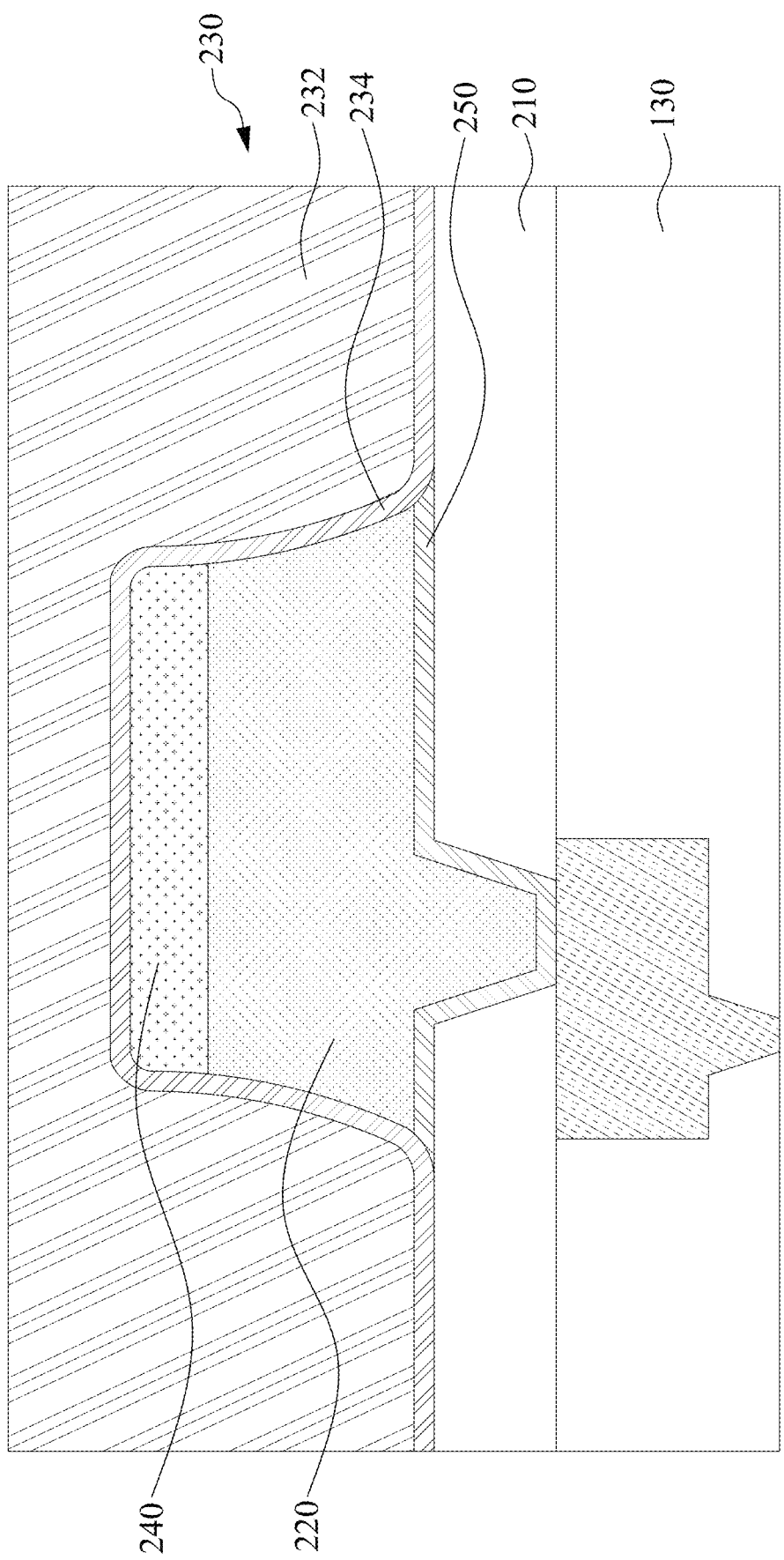
Figure 26B:
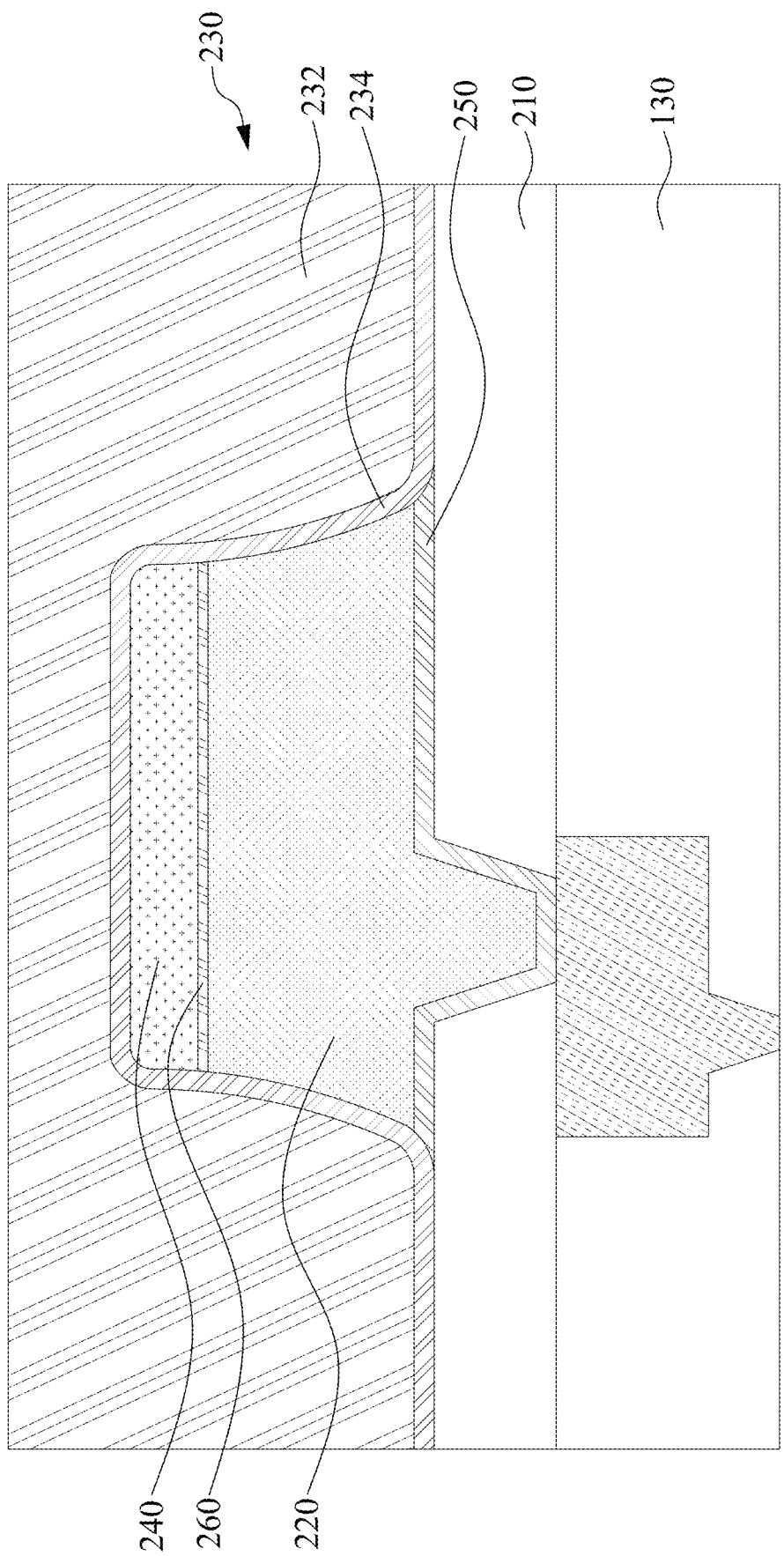

At operation 705, a dielectric structure 230 may be formed by applying a second dielectric layer 234 over the protection structure 240, the sidewall of the electrically-conductive structure 220 and the exposed portion of the top surface of the passivation layer 210, as shown in FIGS. 25A and 25B; and applying a first dielectric layer 232 over the second dielectric layer 234, as shown in FIGS. 26A and 26B.

Figure 27A:
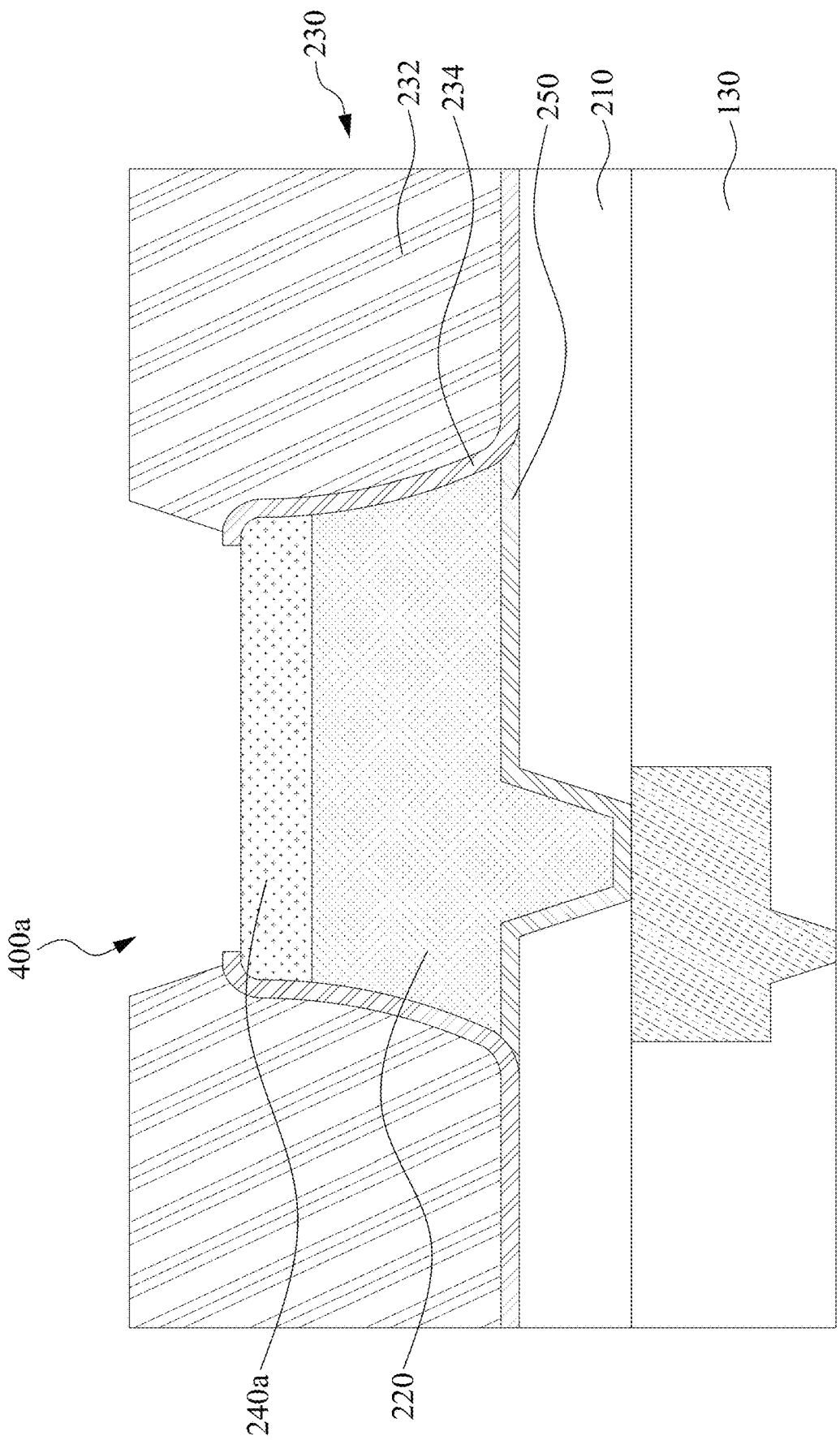
Figure 27B:
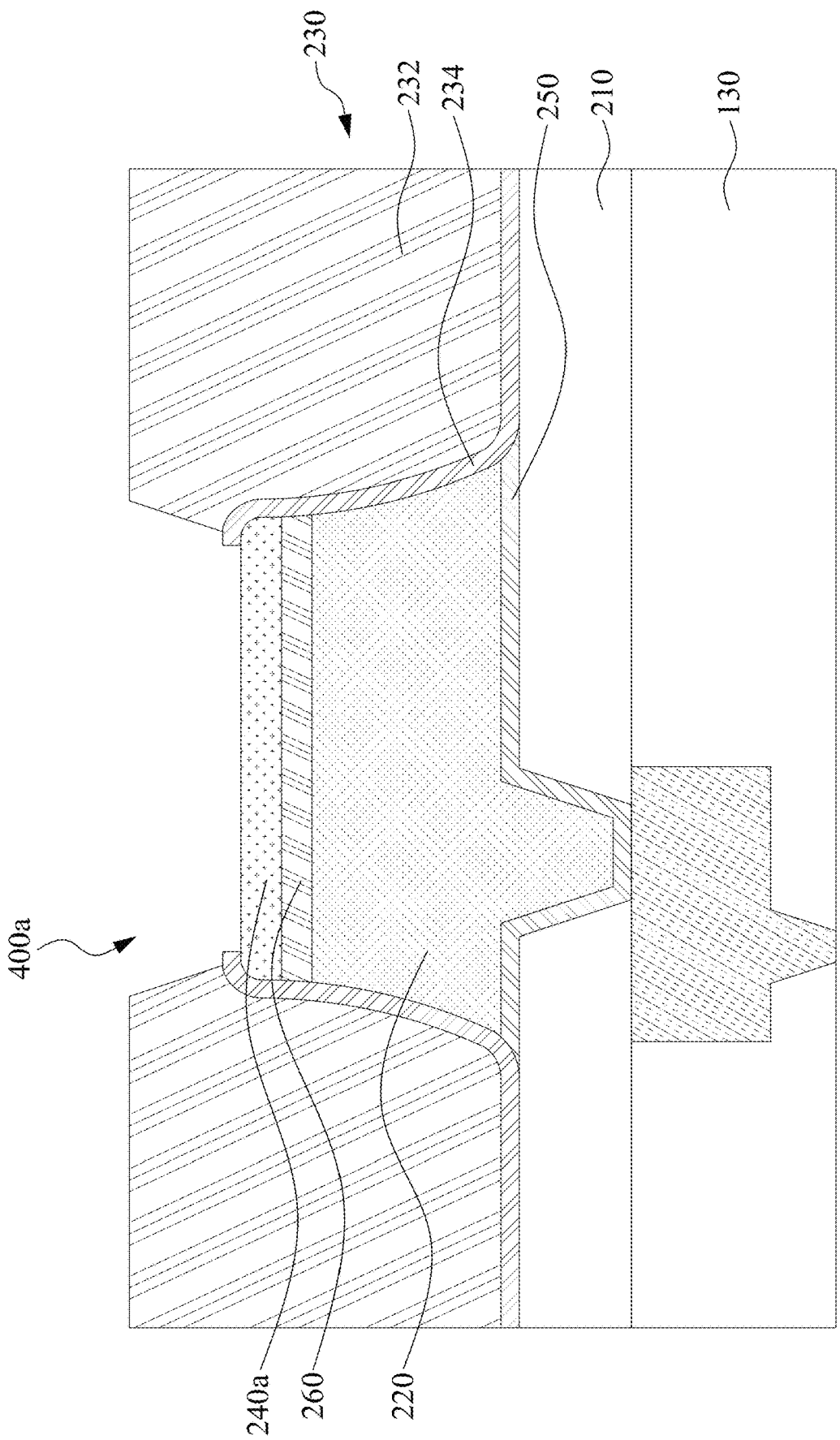
Figure 28A:
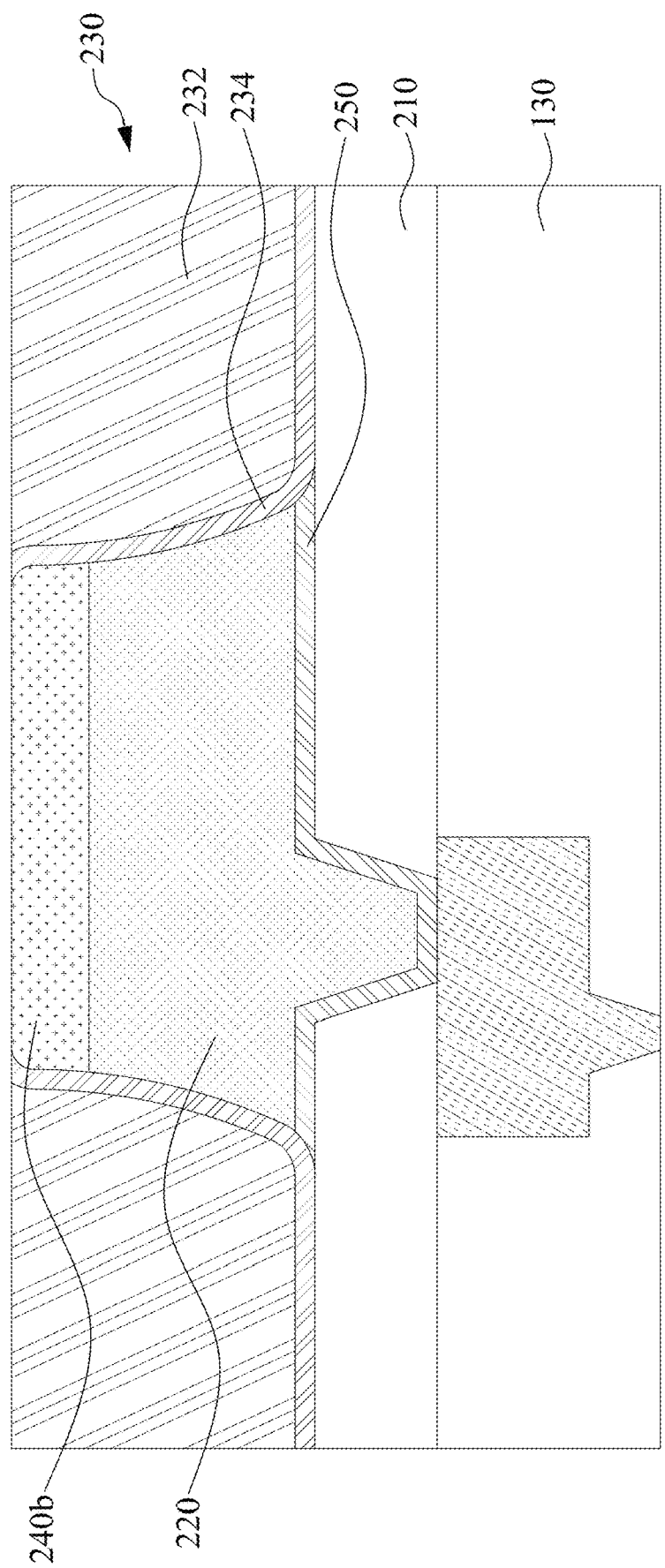
Figure 28B:
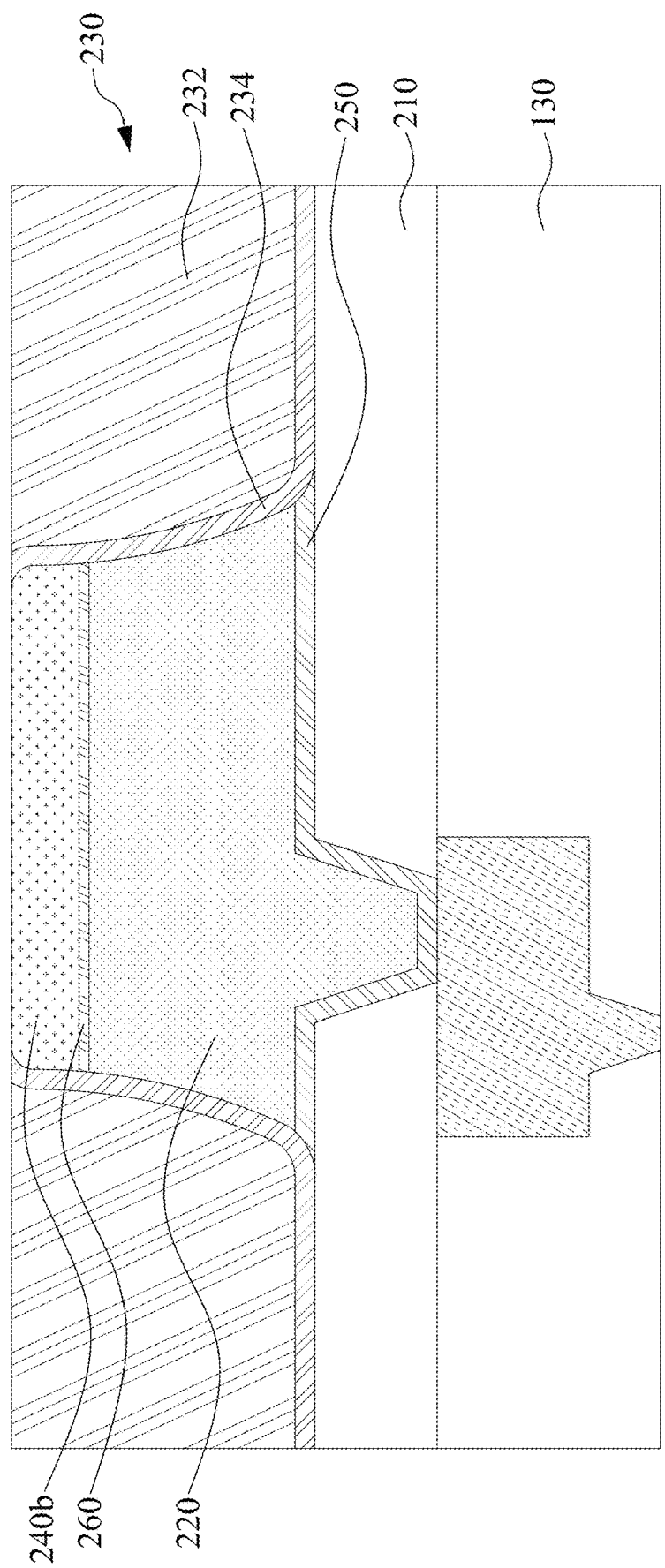

Operation 706 includes exposing at least a portion of a top surface of the protection structure 240. In some embodiments, as shown in FIGS. 27A and 27B, an etching process may be performed to form an opening 400a that exposing a top surface of the protection structure 240a. In some embodiments, as shown in FIGS. 28A and 28B, a CMP operation may be performed to expose the top surface of the protection structure 240b and make top surface of the protection structure 240b align with the top surface of the first dielectric layer 232.

Operation 707 may be similar to operation 506, so the semiconductor structure obtained from operation 706 can undergo a high-temperature test before performing the following wire bonding process or the like. After the operation 707, an external connection structure may be formed on the protection structure 240 as shown in FIGS. 1 and 2. In some embodiments, the external connection structure may comprise an under bump metallization (UBM) structure 310 and a presolder 320 as shown in FIG. 1. In some embodiments, the external connection structure may comprise a wire bond 330 for wire boding or wedge bonding as shown in FIG. 2.

Figure 29:
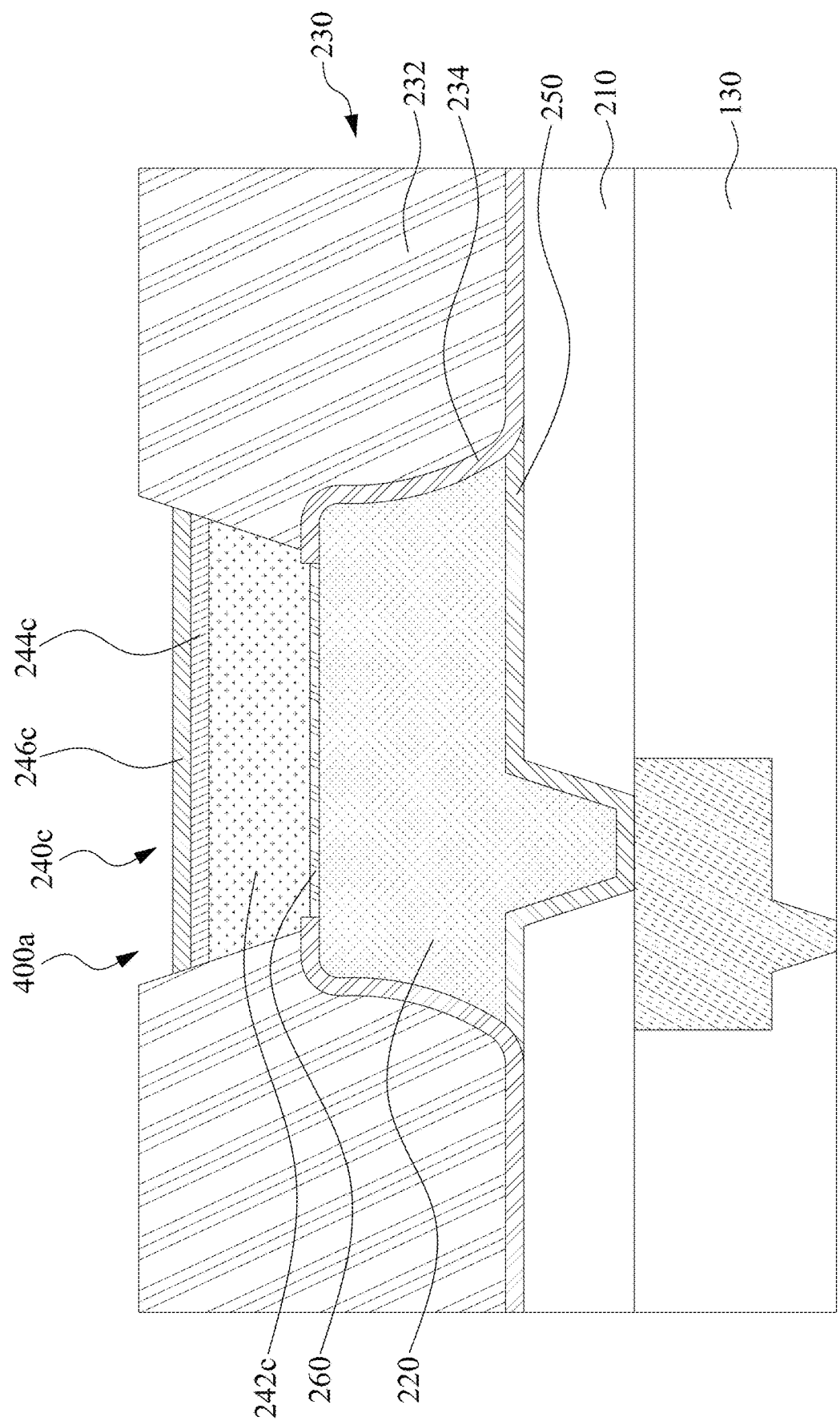
Figure 30:
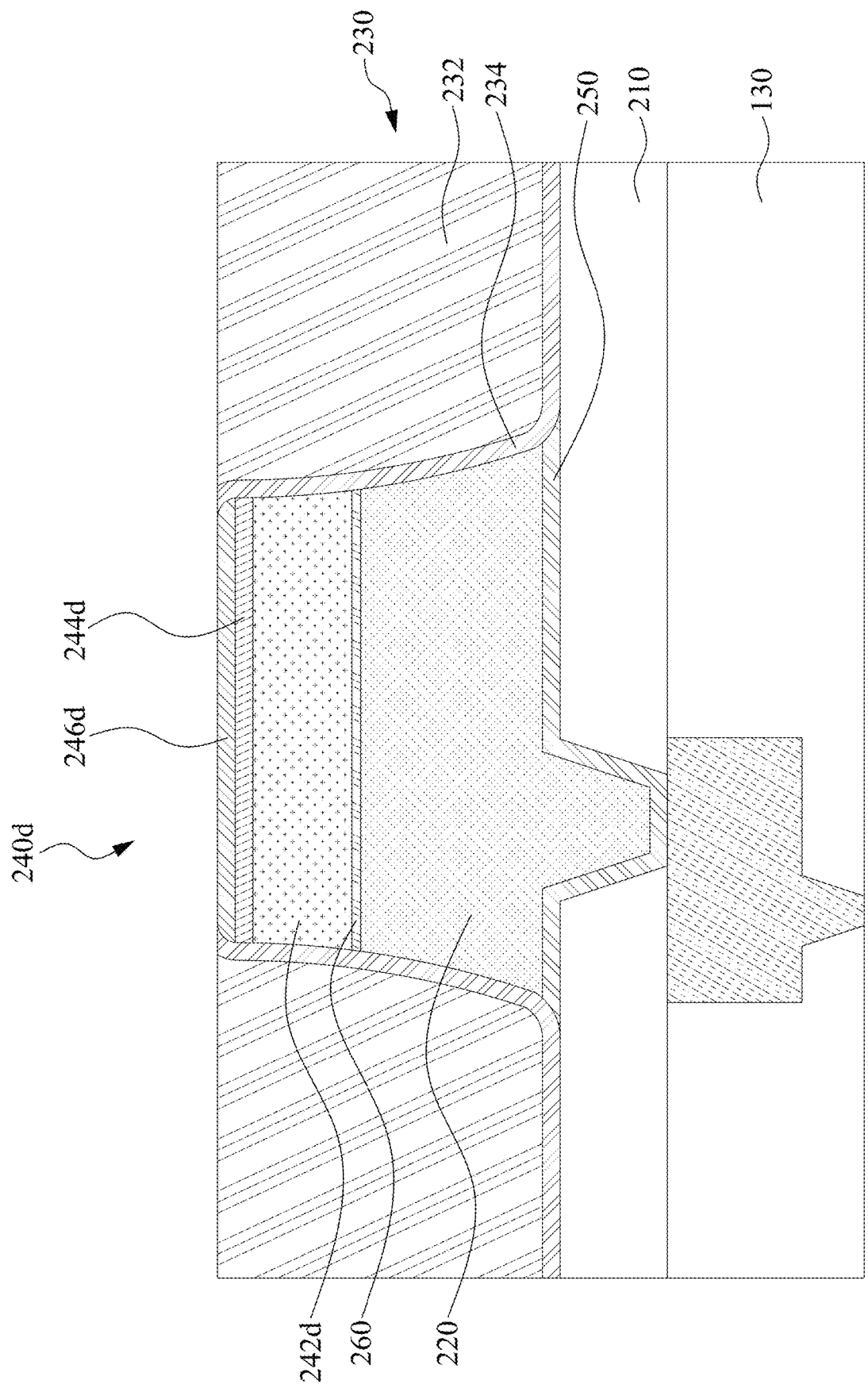

As mentioned above, the protection structure 240 can be a single-layer structure as shown in FIGS. 27A, 27B, 28A and 28B and, alternatively, can be a multi-layer structure as shown in FIGS. 29 and 30. As shown in FIG. 29, the protection structure 240c may include a Ni layer 242c, a Pd layer 244c and an Au layer 246c, and the top surface of the protection structure 240c can be lower than the top surface of the first dielectric layer 232. As shown in FIG. 30, the protection structure 240d may include a Ni layer 242d, a Pd layer 244d and an Au layer 246d, and the top surface of the protection structure 240d can be aligned with the top surface of the first dielectric layer 232.

In the present disclosure, the formation of the protection structure 240 over the electrically-conductive structure 220 can protect the surface of the electrically-conductive structure 220 to eliminate the oxidation of the electrically-conductive structure 220, for example, during the package-level reliability test at a high temperature. Thus, improved measurability and measurement stability can be achieved.

In some embodiments, a package structure comprises a passivation layer formed over an interconnect structure; an electrically-conductive structure on the passivation layer and extending through the passivation layer to electrically contact the interconnect structure; a dielectric structure formed over the passivation layer and surrounding the electrically-conductive structure; a metallic protection structure on a top surface of the electrically-conductive structure, wherein the top surface of the metallic protection structure is aligned with or lower than a top surface of the dielectric structure; and a first barrier layer disposed between the metallic protection structure and the electrically-conductive structure, wherein the electrically-conductive structure is made of a first metal with an oxidation temperature, the metallic protection structure is made of a second metal with an oxidation temperature, and the oxidation temperature of the second metal is higher than that of the first metal; wherein the dielectric structure comprises: a first dielectric layer formed over the passivation layer and surrounding the electrically-conductive structure; and a second dielectric layer disposed between the electrically-conductive structure and the first dielectric layer and disposed between the first dielectric layer and the passivation layer; and wherein an edge of the first barrier layer abuts the first dielectric layer.

In some embodiments, a semiconductor structure comprises an electrically-conductive structure stacking on a passivation layer and extending through the passivation layer to electrically contact an interconnect structure underneath the passivation layer; a dielectric structure formed over the passivation layer and surrounding the electrically-conductive structure; a protection structure formed on the electrically-conductive structure and comprising a Ni layer, a Pd layer and an Au layer stacking on the electrically-conductive structure, wherein the Ni layer is formed on at least a portion of a top surface of the electrically-conductive structure; the Pd layer on the Ni layer; and the Au layer on the Pd layer; and a first barrier layer disposed between the metallic protection structure and the electrically-conductive structure, wherein the dielectric structure comprises: a first dielectric layer formed over the passivation layer and surrounding the electrically-conductive structure; and a second dielectric layer disposed between the electrically-conductive structure and the first dielectric layer and disposed between the first dielectric layer and the passivation layer; and wherein an edge of the first barrier layer abuts the first dielectric layer.

In some embodiments, a method of manufacturing a semiconductor structure comprises receiving a substrate with a interconnect structure formed thereon; forming a passivation layer on the interconnect structure; forming an electrically-conductive structure on a portion of a top surface of the passivation layer and extending through the passivation layer to electrically contact the interconnect structure; forming a dielectric structure over the electrically-conductive structure and the passivation layer by applying a lower dielectric layer over the electrically-conductive structure and a portion of the top surface of the passivation layer exposed from the electrically-conductive structure; applying an upper dielectric layer over the lower dielectric layer; and exposing at least a portion of a top surface of the electrically-conductive structure, so that the upper dielectric layer surrounds the electrically-conductive structure, and the lower dielectric layer is disposed between the electrically-conductive structure and the upper dielectric layer and is also disposed between the upper dielectric layer and the passivation layer; forming a first barrier layer on the electrically-conductive structure, wherein an edge of the first barrier layer abuts the upper dielectric layer; forming a protection structure over the first barrier layer; and performing a test on the semiconductor structure at a heating temperature, wherein the electrically-conductive structure is made of a first metal with an oxidation temperature, the protection structure is made of a second metal with an oxidation temperature, and the oxidation temperature of the second metal is higher than that of the first metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A package structure, comprising:
a passivation layer formed over an interconnect structure;
an electrically-conductive structure on the passivation layer and extending through the passivation layer to electrically contact the interconnect structure;
a dielectric structure formed over the passivation layer and surrounding the electrically-conductive structure;
a metallic protection structure on a top surface of the electrically-conductive structure, wherein the top surface of the metallic protection structure is aligned with or lower than a top surface of the dielectric structure; and
a first barrier layer disposed between the metallic protection structure and the electrically-conductive structure,
wherein the electrically-conductive structure is made of a first metal with an oxidation temperature, the metallic protection structure is made of a second metal with an oxidation temperature, and the oxidation temperature of the second metal is higher than that of the first metal;
wherein the dielectric structure comprises:
a first dielectric layer formed over the passivation layer and surrounding the electrically-conductive structure; and
a second dielectric layer disposed between the electrically-conductive structure and the first dielectric layer and disposed between the first dielectric layer and the passivation layer; and
wherein an edge of the first barrier layer abuts the first dielectric layer.

2. The package structure of claim 1, wherein the metallic protection structure comprises a single-layer structure and comprises an aluminum (Al) layer, a nickel (Ni) layer, a palladium (Pd) layer, a golden (Au) layer, a tungsten (W) layer, a nickel-gold (NiAu) layer, an aluminum-copper (AlCu) layer or a combination thereof.

3. The package structure of claim 1, wherein the metallic protection structure comprises a multi-layer structure.

4. The package structure of claim 3, wherein the metallic protection structure comprises a Ni layer, a Pd layer and an Au layer stacking on the electrically-conductive structure, wherein the Ni layer is formed on the top surface of the electrically-conductive structure; the Pd layer on the Ni layer; and the Au layer on the Pd layer.

5. The package structure of claim 1, further comprising a second barrier layer disposed between the electrically-conductive structure and the passivation layer.

6. The package structure of claim 5, wherein the first barrier layer is made of titanium (Ti), titanium nitride (TiN), tantalum (Ta), tungsten (W) or a combination thereof; and the second barrier layer is made of titanium (Ti), titanium nitride (TiN), tantalum (Ta), tungsten (W) or a combination thereof.

7. The package structure of claim 1, wherein the top surface of the metallic protection structure is aligned with a top surface of the dielectric structure.

8. The package structure of claim 1, wherein the top surface of the metallic protection structure is lower than a top surface of the dielectric structure.

9. The package structure of claim 8, wherein the metallic protection structure on the top surface of the electrically-conductive structure extends along sidewall of the dielectric structure to partially cover a portion of the top surface of the dielectric structure.

10. The package structure of claim 1, further comprising an external connection structure formed on the metallic protection structure.

11. A semiconductor structure, comprising:
an electrically-conductive structure stacking on a passivation layer and extending through the passivation layer to electrically contact an interconnect structure underneath the passivation layer;
a dielectric structure formed over the passivation layer and surrounding the electrically-conductive structure;
a protection structure formed on the electrically-conductive structure and comprising a Ni layer, a Pd layer and an Au layer stacking on the electrically-conductive structure, wherein the Ni layer is formed on at least a portion of a top surface of the electrically-conductive structure; the Pd layer on the Ni layer; and the Au layer on the Pd layer; and
a first barrier layer disposed between the metallic protection structure and the electrically-conductive structure,
wherein the dielectric structure comprises:
a first dielectric layer formed over the passivation layer and surrounding the electrically-conductive structure; and
a second dielectric layer disposed between the electrically-conductive structure and the first dielectric layer and disposed between the first dielectric layer and the passivation layer; and
wherein an edge of the first barrier layer abuts the first dielectric layer.

12. The semiconductor structure of claim 11, wherein the electrically-conductive structure comprises an upper portion overlaid on the passivation layer and a lower portion formed in the passivation layer and extending from the upper portion to the interconnect structure.

13. The semiconductor structure of claim 11, wherein a ratio of thicknesses of the Ni layer to that of the Pd layer is from about 75:1 to about 85:1.

14. The semiconductor structure of claim 11, wherein a ratio of thicknesses of the Ni layer to that of the Au layer is from about 10:1 to about 11:1.

15. The semiconductor structure of claim 11, further comprising a second barrier layer disposed between the electrically-conductive structure and the protection structure.

16. A method for manufacturing a semiconductor structure, comprising:
receiving a substrate with a interconnect structure formed thereon;
forming a passivation layer on the interconnect structure;
forming an electrically-conductive structure on a portion of a top surface of the passivation layer and extending through the passivation layer to electrically contact the interconnect structure;
forming a dielectric structure over the electrically-conductive structure and the passivation layer by applying a lower dielectric layer over the electrically-conductive structure and a portion of the top surface of the passivation layer exposed from the electrically-conductive structure; applying an upper dielectric layer over the lower dielectric layer; and exposing at least a portion of a top surface of the electrically-conductive structure, so that the upper dielectric layer surrounds the electrically-conductive structure, and the lower dielectric layer is disposed between the electrically-conductive structure and the upper dielectric layer and is also disposed between the upper dielectric layer and the passivation layer; forming a first barrier layer on the electrically-conductive structure, wherein an edge of the first barrier layer abuts the upper dielectric layer;

forming a protection structure over the first barrier layer; and performing a test on the semiconductor structure at a heating temperature, wherein the electrically-conductive structure is made of a first metal with an oxidation temperature, the protection structure is made of a second metal with an oxidation temperature, and the oxidation temperature of the second metal is higher than that of the first metal.

17. The method of claim 16, wherein the oxidation temperature of the second metal is higher than the heating temperature.

18. The method of claim 16, further comprising forming an external connection structure on the protection structure after heating the semiconductor structure.

19. The method of claim 16, further comprising forming a second barrier layer on the electrically-conductive structure before forming the protection structure over the electrically-conductive structure.

20. The method of claim 16, wherein forming the protection structure comprises:

forming a nickel (Ni) layer over the electrically-conductive structure;

depositing a palladium (Pd) layer on the Ni layer; and depositing a golden (Au) layer on the Pd layer.

* * * * *